US008601039B2

(12) United States Patent
Mogi et al.

(10) Patent No.: US 8,601,039 B2
(45) Date of Patent: Dec. 3, 2013

(54) COMPUTATION APPARATUS AND METHOD, QUANTIZATION APPARATUS AND METHOD, AND PROGRAM

(75) Inventors: Yukihiko Mogi, Kanagawa (JP); Masato Kamata, Tokyo (JP)

(73) Assignee: Sony Corporation, Tokyo (JP)

( * ) Notice: Subject to any disclaimer, the term of this patent is extended or adjusted under 35 U.S.C. 154(b) by 1108 days.

(21) Appl. No.: 12/563,438

(22) Filed: Sep. 21, 2009

(65) Prior Publication Data

US 2010/0082717 A1 Apr. 1, 2010

(30) Foreign Application Priority Data

Sep. 26, 2008 (JP) ................................. 2008-247682

(51) Int. Cl.
    *G06F 7/00* (2006.01)
(52) U.S. Cl.
    USPC ........................................................ 708/203
(58) Field of Classification Search
    None
    See application file for complete search history.

(56) References Cited

U.S. PATENT DOCUMENTS

| 5,327,520 | A | 7/1994 | Chen |
| 5,946,652 | A * | 8/1999 | Heddle ........................ 704/230 |
| 6,246,979 | B1 | 6/2001 | Carl |
| 6,597,815 | B1 * | 7/2003 | Satoh et al. .................. 382/251 |
| 6,971,013 | B2 | 11/2005 | Mihcak et al. |
| 2001/0050959 | A1 | 12/2001 | Nishio et al. |
| 2003/0118243 | A1 | 6/2003 | Sezer et al. |
| 2005/0063471 | A1 | 3/2005 | Regunathan et al. |
| 2005/0069214 | A1 * | 3/2005 | Hayashi ........................ 382/251 |
| 2005/0097312 | A1 | 5/2005 | Mihcak et al. |
| 2007/0094018 | A1 * | 4/2007 | Zinser et al. .................. 704/219 |
| 2008/0065709 | A1 | 3/2008 | Hack |
| 2010/0063826 | A1 | 3/2010 | Mogi et al. |
| 2010/0082589 | A1 | 4/2010 | Mogi et al. |

FOREIGN PATENT DOCUMENTS

| JP | 06-083400 A | 3/1994 |
| JP | 06-318154 A | 11/1994 |

(Continued)

OTHER PUBLICATIONS

Tomas Alexander, GPU Gems 3 Japanese edition first edition, Book, Born digital Co., Ltd., Aug. 15, 2008.

(Continued)

*Primary Examiner* — Henry Tsai
*Assistant Examiner* — Aurangzeb Hassan
(74) *Attorney, Agent, or Firm* — Wolf, Greenfield & Sacks, P.C.

(57) ABSTRACT

A computation apparatus includes an inverse conversion table creation unit configured to create an inverse conversion table in which discrete values obtained by applying a predetermined conversion on predetermined data correspond to inverse conversion values obtained by applying a conversion inverse to the predetermined conversion on the discrete values, a range decision unit configured to decide in which range the predetermined data is included when the predetermined data is input among ranges where the inverse conversion values adjacent in the inverse conversion table are set as border values, and a discrete value decision unit configured to decide the discrete value corresponding to the inverse conversion value whose value is close to the predetermined data among the inverse conversion values serving as the border values of the range decided by the range decision unit.

7 Claims, 18 Drawing Sheets

(56) References Cited

FOREIGN PATENT DOCUMENTS

| | | |
|---|---|---|
| JP | 10-243028 A | 9/1998 |
| JP | 11-327600 A | 11/1999 |
| JP | 2000-047850 A | 2/2000 |
| JP | 2002-141805 A | 5/2002 |
| JP | 2002-300042 A | 10/2002 |
| JP | 2002-344316 A | 11/2002 |
| JP | 2004-226742 A | 8/2004 |
| JP | 2006-047561 A | 2/2006 |
| JP | 3877683 | 11/2006 |
| JP | 2007-233554 A | 9/2007 |
| JP | 2008-191675 A | 8/2008 |

OTHER PUBLICATIONS

Toshikazu Tajimi, "Programming Technique 7", Unix Magazine, Japan, ASCII Co., Ltd., May 1, 1998, vol. 13, No. 5.

Yasunari Fujita, "Development of the Multimedia Interactive Art Authoring Environment", Information Processing Society article magazine, Japan, Information Processing Society of Japan, Mar. 15, 1995, vol. 36 No. 3.

Junichi Aoe, "Key Search Technique—I", Information processing vol. 33 No. 11, Journal of Information Processing Society of Japan, Japan, Information Processing Society of Japan, vol. 33.

Carrano et al., Data Abstraction and Problem Solving with C++. Aug. 1998;2:51-53,78-87,402-3,598-613.

\* cited by examiner

| QUANTIZED VALUE Z | RANGE OF VALUE Y BEFORE QUANTIZATION |
|---|---|
| 0 | 4.9999600e−01F |
| 1 | 1.8629548e+00F |
| 2 | 3.5652816e+00F |
| 3 | 5.5063962e+00F |
| ⋮ | ⋮ |
| 8189 | 1.6507573e+05F |
| 8190 | 1.6510260e+05F |
| 8191 | 1.6512946e+05F |

| QUANTIZED VALUE Z | INVERSE QUANTIZED VALUE W |
|---|---|
| 0 | 0.0000000e+00F |
| 1 | 1.0000000e+00F |
| 2 | 2.5198421e+00F |
| 3 | 4.3267488e+00F |
| ⋮ | ⋮ |
| 8189 | 1.6505980e+05F |
| 8190 | 1.6508667e+05F |
| 8191 | 1.6511355e+05F |
| 8192 | 1.6514032e+05F |

FIG. 8

```
1       for (m = 0; m < data_size; m += 1)  {
2            if (Y[m] < W[1])   {
3                 k =     1;
4            }
5            else if (Y[m] < W[2])  {
6                 k =     2;
7            }
8            else if (Y[m] < W[3])  {
9                 k =     3;
10           }
  ⋮
N-18         else if (Y[m] < W[8189])  {
N-17              k =  8189;
N-16         }
N-15         else if (Y[m] < W[8190])  {
N-14              k =  8190;
N-13         }
N-12         else if (Y[m] < W[8191])  {
N-11              k =  8191;
N-10         }
N-9          else if (Y[m] < W[8192])  {
N-8               k =  8192;
N-7          }
N-6          if (k == 8192)  {
N-5               Z[m] = 8191;
N-4          }
N-3          else {
N-2               Z[m] = (Y[m] - W[k-1] <= W[k] - Y[m]) ? k - 1 : k;
N-1          }
N       }
```
81

FIG. 13

```
                                                                  201
 1      short dequantize_hash [20] [16]
 2      ={      /*EXPONENT PART index1 = 0 */
 3         {    0,    0,    0,    0,    0,    0,    0,    0,
 4              0,    0,    0,    0,    0,    0,    0,    0,
 5         }, /* EXPONENT PART index1 = 1 */
 6         {    0,    0,    0,    0,    0,    0,    0,    0,
 7              0,    0,    0,    0,    0,    0,    0,    0,
 8         }, /* EXPONENT PART index1 = 2 */
 9         {    1,    1,    1,    1,    1,    1,    1,    1,
10              1,    1,    1,    1,    1,    1,    1,    1,
11         }, /* EXPONENT PART index1 = 3 */
12         {    1,    1,    1,    1,    2,    2,    2,    2,
13              2,    2,    2,    2,    2,    2,    2,    2,
14         }, /* EXPONENT PART index1 = 4 */
15         {    2,    3,    3,    3,    3,    3,    3,    3,
16              3,    4,    4,    4,    4,    4,    4,    4,
17         }, /* EXPONENT PART index1 = 5 */
18         {    4,    5,    5,    5,    5,    6,    6,    6,
19              6,    6,    7,    7,    7,    7,    7,    7,
20         }, /* EXPONENT PART index1 = 6 */
21         {    8,    8,    9,    9,    9,   10,   10,   10,
22             11,   11,   11,   12,   12,   12,   13,   13,
23         }, /* EXPONENT PART index1 = 7 */
24         {   14,   14,   15,   15,   16,   17,   17,   18,
25             18,   19,   19,   20,   21,   21,   22,   22,
26         }, /* EXPONENT PART index1 = 8 */
27         {   23,   24,   25,   26,   27,   28,   29,   30,
28             31,   32,   33,   34,   35,   36,   37,   38,
29         }, /* EXPONENT PART index1 = 9 */
30         {   39,   40,   42,   44,   45,   47,   49,   50,
31             52,   54,   55,   57,   58,   60,   61,   63,
32         },
  ⋮        /*OMITTED*/
N-7        /* EXPONENT PART index1 = 18 */
N-6        { 4096, 4287, 4475, 4660, 4843, 5023, 5201, 5378,
N-5          5552, 5725, 5896, 6065, 6233, 6399, 6564, 6727,
N-4        }, /* EXPONENT PART index1 = 19 */
N-3        { 6889, 7210, 7525, 7837, 8144, 8144, 8144, 8144,
N-2          8144, 8144, 8144, 8144, 8144, 8144, 8144, 8144,
N-1        },
N       }
```

FIG. 15

```
1     float W[8193]
2     = {
3         0.0000000e+00F, /*    0 */
4         1.0000000e+00F, /*    1 */
5         2.5198421e+00F, /*    2 */
6         4.3267488e+00F, /*    3 */
⋮
8192      1.6505980e+05F, /* 8189 */
8193      1.6508667e+05F, /* 8190 */
8194      1.6511355e+05F, /* 8191 */
8195      1.6514032e+05F, /* 8192 */
8196   };
8197   union {
8198       float f;
8199       int i;
8200   } uni0;
8201   for (m = 0; m < data_size; m += 1) {
8202       uni0. f = Y[m];
8203       if (uni0.f < 1.0000000e+00F) {
8204           k =     1;
8205       }
8206       else  if (uni0. f < 2.5198421e+00F) {
8207           k =     2;
8208       }
8209       else  if (uni0. f < 4.3267488e+00F) {
8210           k =     3;
8211       }
8212       else  if (uni0. f < 6.3496046e+00F) {
8213           k =     4;
8214       }
8215       else {
8216           index1 = (uni0. i >> 23) − 125;            /* EXPONENT PART */
8217           index2 = (uni0. i & 0x007FFFFF) >> (23 − 4); /* SIGNIFICAND PART */
8218           k = dequantize_hash [index1] [index2] ;
8219           for ( ; k < 8193; k++) {
8220               if (uni0. f < W[k]) {
8221                   break;
8222               }
8223           }
8224       }
8225       if (k == 8192) {
8226           Z[m] = 8191;
8227       else {
8228           Z[m] = (Y[m] − W[k−1] <= W[k] − Y[m]) ? k − 1 : k;
8229       }
8230   }
```

FIG. 16

```
1      union {
2          float f;
3          int i;
4      } uni0;
5      for (m = 0; m < data_size; m += 1) {
6          uni0. f = Y[m];
7          if     (uni0. f < 0.5000000e-01F) {
8              Z[m] = 0;
9          }
10         else if (uni0. f < 1.7599210e+00F) {
11             Z[m] = 1;
12         }
13         else if (uni0. f < 3.4232955e+00F) {
14             Z[m] = 2;
15         }
16         else if (uni0. f < 5.3381767e+00F) {
17             Z[m] = 3;
18         }
19         else if (uni0. f < 6.3496046e+00F) {
20             Z[m] = 4;
21         }
22         else if (uni0. f < 7.4497423e+00F) {
23             Z[m] = 5;
24         }
25         else {
26             index1 = (uni0. i >> 23) - 125;              /* EXPONENT PART */
27             index2 = (uni0. i & 0x007FFFFF) >> (23 - 4); /* SIGNIFICAND PART */
28             k = dequantize_hash [index1] [index2] ;
29             for ( ; k < 8193; k++) {
30                 if (uni0. f  < W[k]) {
31                     break;
32                 }
33             }
34             if (k == 8192)  {
35                 Z[m] = 8191;
36             }
37             else {
38                 Z[m] = (Y[m] - W[k-1] <= W[k] - Y[m]) ? k - 1 : k;
39             }
40         }
41     }
```

```
1      int Wint[8192]
2      = {
3              0,         /*    0 */
4              256,       /*    1 */
5              645,       /*    2 */
6              1107,      /*    3 */
...
8192           42255308,  /* 8189 */
8193           42262169,  /* 8190 */
8194           42269068,  /* 8191 */
8195           42275921,  /* 8192 */
8196      };
8197      int yin;
8198      for (m = 0; m < data_size; m += 1) {
8199          yin = Y[m];
8200          if (yin < 256) {
8201              Z[m] = 0;
8202          }
8203          else if (yin < 450) {
8204              Z[m] = 1;
8205          }
8206          else if (yin < 876) {
8207              Z[m] = 2;
8208          }
8209          else if (yin < 1367) {
8210              Z[m] = 3;
8211          }
8212          else if (yin < 1625) {
8213              Z[m] = 4;
8214          }
8215          else if (yin < 1907) {
8216              Z[m] = 5;
8217          }
8218          else {
8219              mask = 0x40000000;
8220              for (cnt = 30; cnt >= 0; cnt--) {
8221                  if ((yin & mask > 0) {
8222                      break;
8223                  }
8224                  mask = mask >> 1;
8225              }
8226              yin = yin - mask;
8227              index1 = cnt - 8 + 2;       /* EXPONENT PART */
8228              index2 = yin >> (cnt - 4);  /* SIGNIFICAND PART */
8229              k = dequantize_hash [index1] [index2] ;
8230              for ( ; k < 8193; k++) {
8231                  if (yin < Wint[k]) {
8232                      break;
8233                  }
8234              }
8235              if (k == 8192) {
8236                  Z[m] = 8191;
8237              }
8238              else {
8239                  Z[m] = (yin- Wint[k-1] <= Wint[k] -yin) ? k - 1 : k;
8240              }
8241      }
```

| METHOD | RATIO |
|---|---|
| INVERSE QUANTIZATION TABLE ACCORDING TO EMBODIMENT OF THE PRESENT INVENTION | 1.00 |
| COMBINATION OF CONDITIONAL SENTENCE AND HASH TABLE ACCORDING TO EMBODIMENT OF THE PRESENT INVENTION | 0.70 |
| CALCULATE INTERMEDIATE VALUE OF CONDITIONAL SENTENCE ACCORDING TO EMBODIMENT OF THE PRESENT INVENTION | 0.45 |

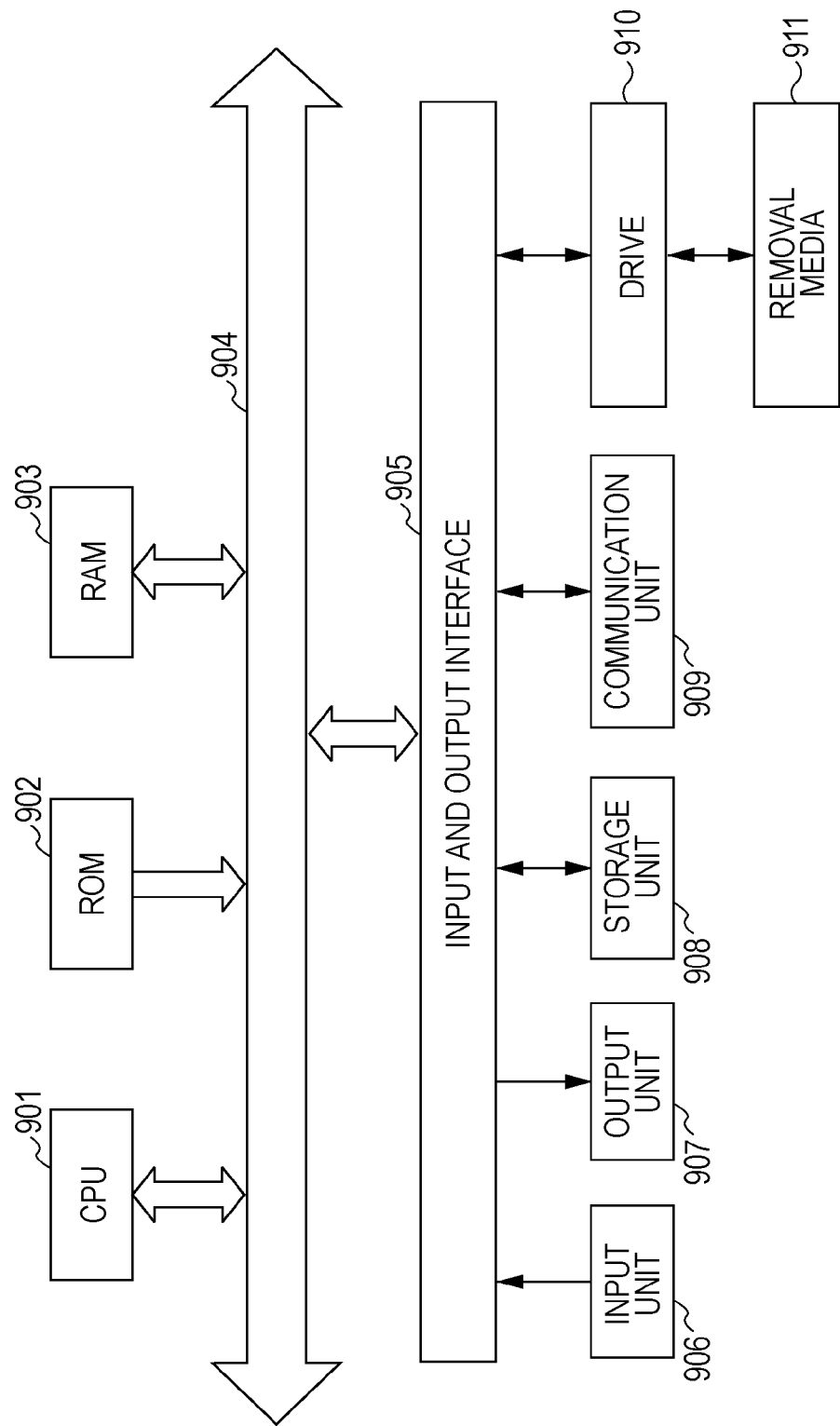

COMPUTATION APPARATUS AND METHOD, QUANTIZATION APPARATUS AND METHOD, AND PROGRAM

BACKGROUND OF THE INVENTION

1. Field of the Invention

The present invention relates to a computation apparatus and method, a quantization apparatus and method, and a program. In particular, the invention relates to a computation apparatus and method, a quantization apparatus and method, and a program with which a memory capacity used for a processing can be reduced.

2. Description of the Related Art

To deal with an analog signal in a digital signal processing, in addition to a sampling processing for performing a discretization on a domain of the signal, a quantization processing for performing a discretization on a range of the signal is carried out. Also, in a case where the digital signal already subjected to the discretization on the range is dealt with at a still smaller amount of data, a still rougher discretization is carried out in some cases, and this process is also included in the quantization processing. In the quantization processing, a value after the discretization is referred to as quantized value, and a code to which the quantized value is assigned is referred to as quantization code. Also, an interval between adjacent quantized values is referred to as quantization step width, and the number of the quantized values included in the range is referred to as the number of quantization steps.

On the other hand, in a case where the digital signal obtained as the result of the digital signal processing is output as an analog signal, for example, from the quantization code, a processing of reconstructing the original continuous values or the values subjected to the discretization at a small quantization step width is carried out. This process is referred to as inverse quantization processing. In the inverse quantization processing, the quantized values corresponding to the quantization code are converted through an inverse quantization conversion to reconstruct the original values.

At this time, the quantized values are obtained while the continuous values are approximate to the discrete values in the quantization processing, and accordingly errors between the reconstructed values through the inverse quantization processing (inverse quantized values) and the original values are generated through the quantization processing. Therefore, in the inverse quantization processing, the values before performing the quantization processing (values before the quantization) are not reconstructed in a completed manner, and the reconstructed inverse quantized values are approximate values including the quantization errors.

In general, in a case where the quantization step width is large, the quantization errors become large, but the number of the quantization steps becomes small. Thus, the data amount used for representing the quantization code becomes small. On the other hand, in a case where the quantization step width is small, the quantization errors become small, but the number of the quantization steps becomes large. Thus, the data amount used for representing the quantization code becomes large.

The quantization in which the quantization step width is constant is referred to as linear quantization. In contrast, the quantization in which the quantization step width is not constant is referred to as nonlinear quantization processing. As compared with the linear quantization processing, the nonlinear quantization processing has the following characteristics.

First, in a case where an appearance probability of the signals is biased, by carrying out a nonlinear quantization processing in which the quantization step width is set smaller in a vicinity of a value (signal) whose appearance probability is high and the quantization step width is set larger in a vicinity of a value (signal) whose appearance probability is low, it is possible to set the quantization errors smaller in average as compared with a linear quantization processing. Also, through a similar method, by adjusting the number of the quantization steps in accordance with the appearance probability of the signals, it is possible to reduce the data amount without deteriorating the average quantization errors as compared with the linear quantization processing.

Also, in particular, in the case of an audio signal or an image signal, while following characteristics of the acoustic sense and the visual sense, by setting the quantization step width smaller in a vicinity of a value to which human beings are sensuously responsive and the quantization step width larger in a vicinity of a value to which human beings are not sensuously responsive, it becomes difficult for the people to perceive the quantization errors as compared with the linear quantization processing. In addition, through a similar method, by adjusting the number of the quantization steps in accordance with the characteristics of the human sensory perception, as compared with the linear quantization processing, it is possible to reduce the data amount without deteriorating the errors perceived by the people.

Therefore, the nonlinear quantization processing is utilized in various fields dealing with the signals and the like conforming to the human sensuous characteristics such as the signal in which the appearance probability of the signals is biased, the audio signal, or the image signal.

Incidentally, for a system for coding the audio signal, an MPEG (Moving Picture Expert Group) audio standard is proposed. The MPEG audio standard includes a plurality of coding systems. In ISO/IEC (International Organization for Standardization/International Electrotechnical Commission) 13818-7, a coding system of MPEG-2 audio standard AAC (Advanced Audio Coding) is standardized.

Also, in the further expanded ISO/IEC 14496-3, a coding system of MPEG-4 audio standard AAC is standardized. It should be noted that hereinafter, the MPEG-2 audio standard AAC and the MPEG-4 audio standard AAC are collectively referred to as AAC standard.

An audio coding apparatus compliant with the AAC standard in a related art is provided with an auditory psychological model holding unit, a gain control unit, a spectrum processing unit, a quantization/coding unit, and a multiplexer unit.

In the auditory psychological model holding unit, the audio signal input to the audio coding apparatus is converted into blocks along the time axis and analyzed in conformity to the human auditory characteristics for each divided band so that a permissible error intensity of the respective divided bands is calculated.

Also, the input audio signal is divided into four frequency bands at regular intervals in the gain control unit, and a gain adjustment is performed on a predetermined band.

Furthermore, the audio signal after the gain adjustment is converted into spectrum data of the frequency domain in the spectrum processing unit, and a predetermined processing is applied on the basis of the permissible error intensity calculated by the auditory psychological model holding unit. Then, the spectrum data on which the predetermined processing is applied (the audio signal) is converted into a code string in the quantization/coding unit, and various types of information are multiplexed in the multiplexer unit to be output as a bit stream.

In the above-mentioned quantization/coding unit, the non-linear quantization processing is performed on the audio signal.

Also, in the quantization processing on the audio signal, the quantization/coding unit performs the inverse quantization on the quantized values with respect to all the input values to check whether or not the quantization errors stay in a predetermined range. The quantization errors can be obtained by calculating a difference between the inverse quantized value and the input value, and in the quantization/coding unit, it is determined whether or not this difference takes a value in a predetermined range.

In the quantization processing or the inverse quantization processing described above, a method is proposed in which a table previously holding values of a conversion expression is prepared, and a conversion value is obtained with respect to the input value by referring to the table (for example, see Japanese Patent No. 3877683).

According to the method Japanese Patent No. 3877683, in a nonlinear inverse quantization processing, as the quantized value which is the input value is an integer value, by previously creating a relation between the quantized value serving as the input value and the inverse quantized value as an inverse quantization table, at the time of the execution of the inverse quantization processing, it is possible to uniquely decide the inverse quantized value on the basis of the inverse quantization table.

Similarly, in a nonlinear quantization processing too, by previously creating a relation as a quantization table between a quantized value Z and a range in which a value before the quantization serving as the input value may take, at the time of the execution of the quantization processing, it is possible to uniquely decide the quantized value on the basis of the quantization table.

SUMMARY OF THE INVENTION

However, according to the above-mentioned method, the total number of the table values in the quantization table and the table values in the inverse quantization table should be prepared, which leads to use of a large amount of memory capacity.

The present invention has been made in view of the above-mentioned circumstances, and it is desirable to further reduce the memory capacity used for the processing.

According to an embodiment of the present invention, there is provided a computation apparatus including: inverse conversion table creation means configured to create an inverse conversion table in which discrete values obtained by applying a predetermined conversion on predetermined data correspond to inverse conversion values obtained by applying a conversion inverse to the predetermined conversion on the discrete values; range decision means configured to decide in which range the predetermined data is included when the predetermined data is input among ranges where the inverse conversion values adjacent in the inverse conversion table are set as border values; and discrete value decision means configured to decide the discrete value corresponding to the inverse conversion value whose value is close to the predetermined data among the inverse conversion values serving as the border values of the range decided by the range decision means.

The computation apparatus can further include hash table creation means configured to create a hash table on the basis of the inverse conversion table, and the range decision means can decide an initial search value of the range in the inverse conversion table for at least one of the ranges on the basis of the hash table and decide in which range the predetermined data is included in the inverse conversion table on the basis of the initial search value.

The hash table creation means can create the hash table by using at least one of an exponent part and a significand part of the inverse conversion values serving as the border values of the range in the inverse conversion table.

The range decision means can perform a binary search on the range in which the predetermined data is included in the inverse conversion table when the predetermined data is input.

According to an embodiment of the present invention, there is provided a computation method including the steps of: creating an inverse conversion table in which discrete values obtained by applying a predetermined conversion on predetermined data correspond to inverse conversion values obtained by applying a conversion inverse to the predetermined conversion on the discrete values; deciding in which range the predetermined data is included when the predetermined data is input among ranges where the inverse conversion values adjacent in the inverse conversion table are set as border values; and deciding the discrete value corresponding to the inverse conversion value whose value is close to the predetermined data among the inverse conversion values serving as the border values of the range decided in the range decision step.

According to an embodiment of the present invention, there is provided a program for instructing a computer to execute a processing including the steps of: creating an inverse conversion table in which discrete values obtained by applying a predetermined conversion on predetermined data correspond to inverse conversion values obtained by applying a conversion inverse to the predetermined conversion on the discrete values; deciding in which range the predetermined data is included when the predetermined data is input among ranges where the inverse conversion values adjacent in the inverse conversion table are set as border values; and deciding the discrete value corresponding to the inverse conversion value whose value is close to the predetermined data among the inverse conversion values serving as the border values of the range decided in the range decision step.

According to another embodiment of the present invention, there is provided a quantization apparatus including: inverse quantization table creation means configured to create an inverse quantization table in which quantized values obtained by applying a quantization on predetermined data correspond to inverse quantized values obtained by applying an inverse quantization on the quantized values; range decision means configured to decide in which range the predetermined data is included when the predetermined data is input among ranges where the inverse quantized values adjacent in the inverse quantization table are set as border values; and quantized value decision means configured to decide the quantized value corresponding to the inverse quantized value whose value is close to the predetermined data among the inverse quantized values serving as the border values of the range decided by the range decision means.

According to another embodiment of the present invention, there is provided a quantization method including the steps of: creating an inverse quantization table in which quantized values obtained by applying a quantization on predetermined data correspond to inverse quantized values obtained by applying an inverse quantization on the quantized values; deciding in which range the predetermined data is included when the predetermined data is input among ranges where the inverse quantized values adjacent in the inverse quantization table are set as border values; and deciding the quantized value corresponding to the inverse quantized value whose value is close to the predetermined data among the inverse quantized values serving as the border values of the range decided in the range decision step.

According to another embodiment of the present invention, there is provided a program for instructing a computer to execute a processing including the steps of: creating an inverse quantization table in which quantized values obtained by applying a quantization on predetermined data correspond to inverse quantized values obtained by applying an inverse quantization on the quantized values; deciding in which range the predetermined data is included when the predetermined data is input among ranges where the inverse quantized values adjacent in the inverse quantization table are set as border values; and deciding the quantized value corresponding to the inverse quantized value whose value is close to the predetermined data among the inverse quantized values serving as the border values of the range decided in the range decision step.

According to still another embodiment of the present invention, there is provided a computation apparatus including: conversion table creation means configured to create a conversion table in which a discrete value obtained by applying a predetermined conversion on predetermined data corresponds to a range of the predetermined data in which the discrete value may take; and calculation means configured to calculate, when the discrete value is input, in the conversion table, from the data in the conversion table corresponding to the input discrete value, an inverse conversion value obtained by applying a conversion inverse to the predetermined conversion on the discrete value.

According to still another embodiment of the present invention, there is provided a computation method including the steps of: creating a conversion table in which a discrete value obtained by applying a predetermined conversion on predetermined data corresponds to a range of the predetermined data in which the discrete value may take; and calculating, when the discrete value is input, in the conversion table, from the data in the conversion table corresponding to the input discrete value, an inverse conversion value obtained by applying a conversion inverse to the predetermined conversion on the discrete value.

According to still another embodiment of the present invention, there is provided a program for instructing a computer to execute a processing including the steps of: creating a conversion table in which a discrete value obtained by applying a predetermined conversion on predetermined data corresponds to a range of the predetermined data in which the discrete value may take; and calculating, when the discrete value is input, in the conversion table, from the data in the conversion table corresponding to the input discrete value, an inverse conversion value obtained by applying a conversion inverse to the predetermined conversion on the discrete value.

According to still yet another embodiment of the present invention, there is provided an inverse quantization apparatus including: quantization table creation means configured to create a quantization table in which a quantized value obtained by applying a quantization on predetermined data corresponds to a range of predetermined data in which the quantized value may take; and calculation means configured to calculate, when the quantized value is input, in the quantization table, from the data in the quantization table corresponding to the input quantized value, an inverse quantization value obtained by applying an inverse quantization on the quantized value.

According to still yet another embodiment of the present invention, there is provided an inverse quantization method including the steps of: creating a quantization table in which a quantized value obtained by applying a quantization on predetermined data corresponds to a range of predetermined data in which the quantized value may take; and calculating, when the quantized value is input, in the quantization table, from the data in the quantization table corresponding to the input quantized value, an inverse quantization value obtained by applying an inverse quantization on the quantized value.

According to still yet another embodiment of the present invention, there is provided a program for instructing a computer to execute a processing including the steps of: creating a quantization table in which a quantized value obtained by applying a quantization on predetermined data corresponds to a range of predetermined data in which the quantized value may take; and calculating, when the quantized value is input, in the quantization table, from the data in the quantization table corresponding to the input quantized value, an inverse quantization value obtained by applying an inverse quantization on the quantized value.

According to the embodiment of the present invention, the inverse conversion table is created in which the discrete values obtained by applying the predetermined conversion on the predetermined data correspond to the inverse conversion values obtained by applying the conversion inverse to the predetermined conversion on the discrete values, when the predetermined data is input, it is decided in which range the predetermined data is included among the ranges where the inverse conversion values adjacent in the inverse conversion table are set as the border values, and the discrete value corresponding to the inverse conversion value whose value is close to the predetermined data is decided among the inverse conversion values serving as the border values of the decided range.

According to the embodiment of the present invention, the inverse quantization table is created in which the quantized values obtained by applying the quantization on the predetermined data correspond to the inverse quantized values obtained by applying the inverse quantization on the quantized values, when the predetermined data is input, it is decided in which range the predetermined data is included among the ranges where the inverse quantized values adjacent in the inverse quantization table are set as the border values, and the quantized value corresponding to the inverse quantized value whose value is close to the predetermined data is decided among the inverse quantized values serving as the border values of the decided range.

According to the embodiment of the present invention, the conversion table is created in which the discrete value obtained by applying the predetermined conversion on the predetermined data corresponds to the range of the predetermined data in which the discrete value may take, and when the discrete value is input, in the conversion table, from the data in the conversion table corresponding to the input discrete value, the inverse conversion value obtained by applying the conversion inverse to the predetermined conversion on the discrete value is calculated.

According to the embodiment of the present invention, the quantization table is created in which the quantized value obtained by applying the quantization on the predetermined data corresponds to the range of the predetermined data in which the quantized value may take, and when the quantized value is input, in the quantization table, from the data in the quantization table corresponding to the input quantized value, the inverse quantization value obtained by applying the inverse quantization on the quantized value is calculated.

According to the embodiments of the present invention, it is possible to reduce the memory capacity used for the processing.

BRIEF DESCRIPTION OF THE DRAWINGS

FIG. 8 shows an example of a program describing a processing in steps S62 and S63 in the flow chart of FIG. 7 in C language;

FIG. 13 shows an example describing the hash table in C language;

FIG. 15 shows an example of a program describing a processing in steps S161 to S167 in the flow chart of FIG. 14 in C language;

FIG. 16 shows an example of a program describing a processing in C language in a case of using an intermediate value of the inverse quantized values in a conditional statement in the program of FIG. 15;

FIG. 17 shows an example of a program describing in C language an example of a case in which a floating point number is a fixed-point number in the example of the program of FIG. 16;

FIG. 25 is a block diagram of a configuration example of a personal computer.

DESCRIPTION OF THE PREFERRED EMBODIMENTS

Hereinafter, embodiments of the present invention will be described with reference to the present invention.

1. First Embodiment

Configuration Example of an Audio Coding Apparatus

Figure 1:
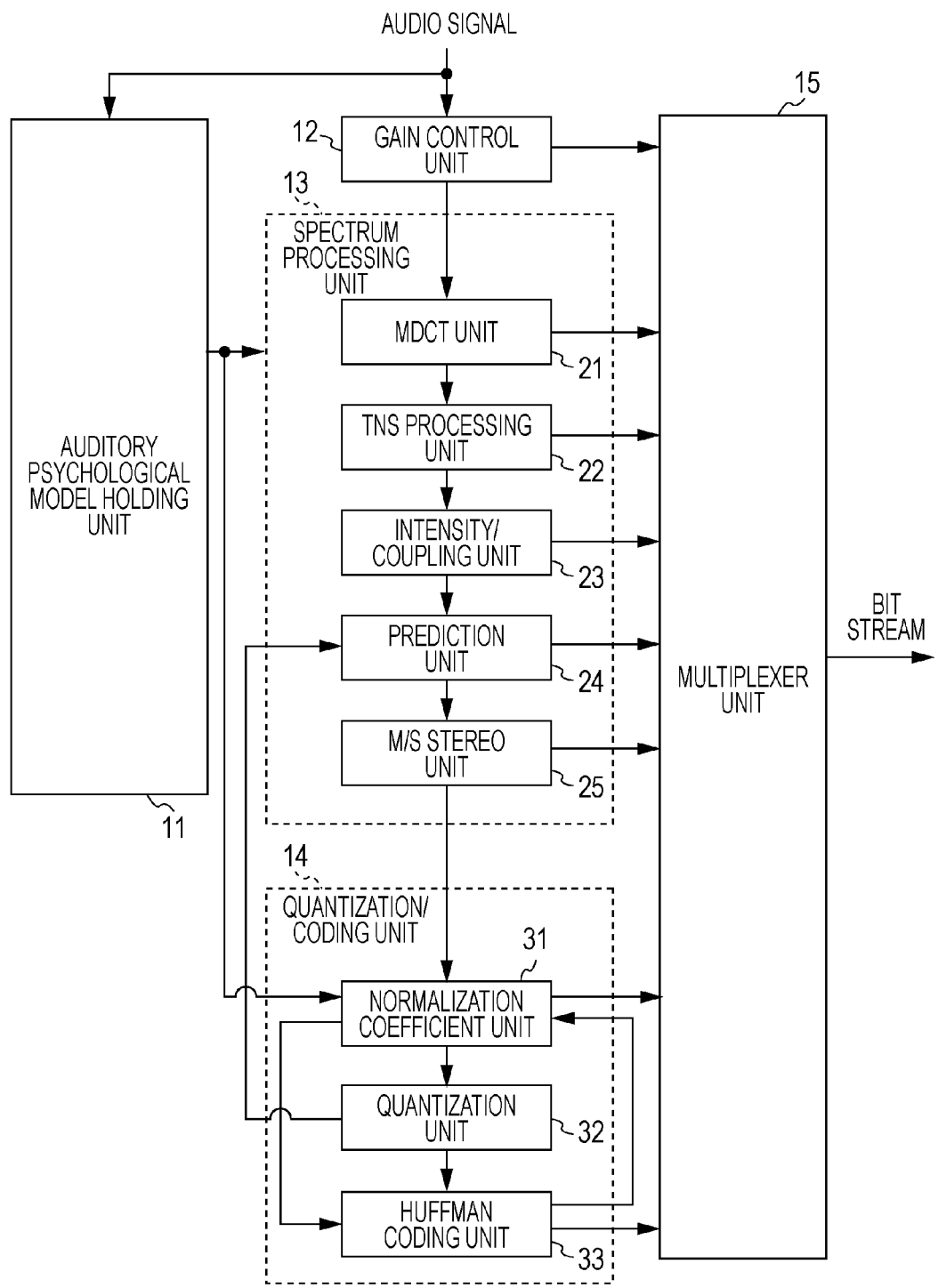
FIG. 1 is a block diagram of a configuration example of an audio coding apparatus according to an embodiment to which the present invention is applied.

FIG. 1 shows a configuration example of an audio coding apparatus according to an embodiment to which the present invention is applied.

The audio coding apparatus of FIG. 1 is composed of an auditory psychological model holding unit 11, a gain control unit 12, a spectrum processing unit 13, a quantization/coding unit 14, and a multiplexer unit 15.

An audio signal input to the audio coding apparatus is supplied to the auditory psychological model holding unit 11 and the gain control unit 12. The auditory psychological model holding unit 11 converts the input audio signal into blocks along the time axis and analyzes the audio signal converted into the blocks in conformity to the human auditory characteristics for each divided band so that a permissible error intensity of the respective divided bands is calculated. The auditory psychological model holding unit 11 supplies the calculated permissible error intensity to the spectrum processing unit 13 and the quantization/coding unit 14.

Among three profiles including Main, LC (Low Complexity), and SSR (Scalable Sampling Rate) prepared as coding algorithms of the AAC standard, the gain control unit 12 is used only for the SSR profile. The gain control unit 12 divides the input audio signal into four frequency bands at regular intervals and performs, for example, a gain adjustment on the bands except for the lowest band to be supplied to the spectrum processing unit 13.

The spectrum processing unit 13 converts the audio signal subjected to the gain adjustment in the gain control unit 12 into spectrum data of the frequency domain. Also, the spectrum processing unit 13 controls the respective units of the spectrum processing unit 13 on the basis of the permissible error intensity supplied from the auditory psychological model holding unit 11 and applies a predetermined processing on the spectrum data.

The spectrum processing unit 13 is provided with an MDCT (Modified Discrete Cosine Transform) unit 21, a TNS (Temporal Noise Shaping) processing unit 22, an intensity/coupling unit 23, a prediction unit 24, and an M/S stereo (Middle/Side Stereo) unit 25.

The MDCT unit 21 converts the audio signal in the time domain supplied from the gain control unit 12 into spectrum data in the frequency domain (MDCT coefficient) to be supplied to the TNS processing unit 22. The TNS processing unit 22 regards the spectrum data from the MDCT unit 21 as the signal in time domain to perform a linear prediction and performs a prediction filtering on the spectrum data to be supplied as a bit stream to the intensity/coupling unit 23. The intensity/coupling unit 23 applies a compression processing utilizing a correlation of different channels (stereo correlation coding processing) on the audio signal serving as the spectrum data from the TNS processing unit 22.

The prediction unit 24 is used only for the Main profile among the above-mentioned three profiles. The prediction unit 24 uses the audio signal subjected to the stereo correlation coding in the intensity/coupling unit 23 and the audio signal supplied from the quantization/coding unit 14 to perform a prediction coding and supplies the audio signal thus obtained to the M/S stereo unit 25. The M/S stereo unit 25 performs the stereo correlation coding on the audio signal from the prediction unit 24 to be supplied to the quantization/coding unit 14.

The quantization/coding unit 14 is provided with a normalization coefficient unit 31, a quantization unit 32, and a Huffman coding unit 33. The quantization/coding unit 14 converts the audio signal from the M/S stereo unit 25 of the spectrum processing unit 13 into a code string to be supplied to the multiplexer unit 15.

The normalization coefficient unit 31 supplies the audio signal from the M/S stereo unit 25 to the quantization unit 32 and calculates a normalization coefficient used for the quantization for the audio signal on the basis of the audio signal to be supplied to the quantization unit 32 and the Huffman coding unit 33. In the quantization apparatus of FIG. 1, for example, the permissible error intensity from the auditory psychological model holding unit 11 is used to calculate a quantization step parameter as the normalization coefficient for each divided band.

The quantization unit 32 uses the normalization coefficient from the normalization coefficient unit 31 to perform nonlinear quantization on the audio signal supplied from the normalization coefficient unit 31 and supplies the audio signal thus obtained (quantized value) to the Huffman coding unit 33 and the prediction unit 24. On the basis of a previously determined Huffman coding table, the Huffman coding unit 33 performs the Huffman coding on the normalization coefficient from the normalization coefficient unit 31 and the quantized value from the quantization unit 32 to be supplied to the multiplexer unit 15.

The multiplexer unit 15 multiplexes various types of information generated in the process of the coding on the audio signal which are respectively supplied from the gain control unit 12 as well as the components from the MDCT unit 21 up to the normalization coefficient unit 31, with the Huffman code from the Huffman coding unit 33. As a result, the multiplexer unit 15 generates a bit stream of the audio signal and outputs the generated bit stream of the audio signal.

A nonlinear quantization processing by the quantization unit of the general audio coding apparatus is performed by calculating Expression (1) while the value of the audio signal from the spectrum processing unit is set as an input value X and the quantization step parameter representing the quantization step width is set as q. That is, as Expression (1) is calculated, a quantized value Z is found from the input value X functioning as the audio signal.

[Expression 1]

$$Z = (\text{int})\left(\left(\frac{X}{2^{q/4}}\right)^{3/4} - 0.0946 + 0.5\right) \quad (1)$$

It should be noted that in Expression (1), (int)(A) represents a computation for obtaining an integer part by cutting off a fractional part of a floating point number A.

In the coding of the AAC standard, when the quantized value Z is regulated as 14 bits and a value Y before the quantization=$X/2^{q/4}$ is established, the value Y before the quantization takes a value in a range of $0 \leq Y \leq 8191.5943^{(4/3)}$ through an inverse operation. Therefore, the value Y before Z takes an integer in a range of $0 \leq Z \leq 8191$, and in order that the quantized value Z takes a value in this range, the quantization parameter q representing the quantization step width is decided.

Also, in the quantization unit, the quantized values Z with respect to all the input values X are subjected to the inverse quantization to check whether or not the quantization error is contained in a predetermined range. For example, the inverse quantization is performed through the computation of Expression (2), and an inverse quantized value W is obtained.

[Expression 2]

$$W = (Z)^{4/3} \quad (2)$$

Then, the quantization error is obtained by calculating a difference between the inverse quantized value W and the input value X, and it is determined whether or not this difference takes a value within the predetermined range.

Relation Among the Value Before the Quantization, the Quantized Value, and the Inverse Quantized Value Now, with reference to FIGS. 2 to 4, a relation among the value Y before the quantization, the quantized value Z, and the inverse quantized value W will be described.

Figures 2, 3, 4:
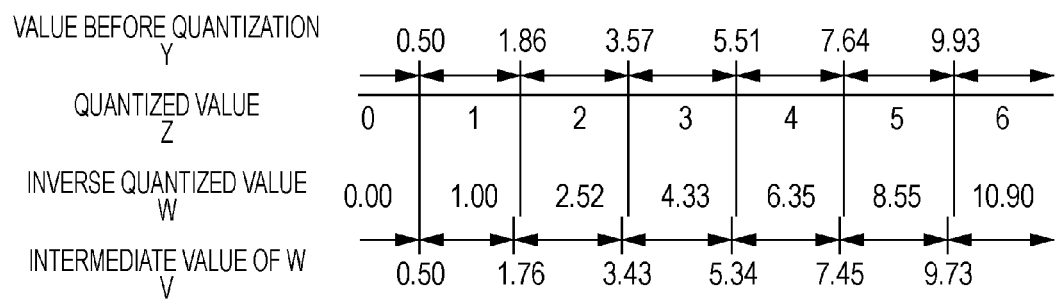
FIG. 2 shows an example of a quantization table.
FIG. 3 shows an example of an inverse quantization table.
FIG. 4 is an explanatory diagram for describing a relation among a value before a quantization, a quantized value, and an inverse quantized value.

FIG. 2 shows a quantization table representing a range of the value Y before the quantization calculated through Expression (1) at the time of $Y=X/2^{q/4}$ with respect to the quantized value Z (=0 to 8191) in Expression (1).

In FIG. 2, it is represented that when the value Y before the quantization is in the range of $0 \leq Y \leq 4.9999600\text{e}-01\text{F}$, the quantized value Z is 0, when the value Y before the quantization is in the range of $4.9999600\text{e}-01\text{F} \leq Y < 1.8629548\text{e}+00\text{F}$, the quantized value Z is 1, ..., when the value Y before the quantization is in the range of $1.6510260\text{e}+05\text{F} \leq Y < 1.6512946\text{e}+05\text{F}$, the quantized value Z is 8191.

FIG. 3 shows an inverse quantization table showing the inverse quantized value W calculated through Expression (2) with respect to the quantized value (=0 to 8192).

In FIG. 3, it is represented that when the quantized value Z is 0, the inverse quantized value W is 0.0000000e+00F, when the quantized value Z is 1, the inverse quantized value W is 1.0000000e+00F, ..., when the quantized value Z is 8192, the inverse quantized value W is 1.6514032e+05F.

FIG. 4 is an explanatory diagram for describing a relation among a range of the value Y before the quantization, the quantized value Z, and the inverse quantized value W.

FIG. 4 shows a range of the values Y before the quantization which may take the respective quantized values Z=0 to 6 assigned on the basis of the quantization table in FIG. 2 and the inverse quantized values W respectively corresponding to the quantized values Z assigned on the basis of the inverse quantization table in FIG. 3.

It should be noted that in FIG. 4, a notation of the value is up to two places of decimals.

At this time, when an intermediate value of the inverse quantized values W corresponding to the quantized values Z is set as V, a difference hardly exists between the intermediate value V of the inverse quantized values W and a border value in the range of the value Y before the quantization which may take the quantized value Z, and these values can be regarded as substantially equal to each other.

For example, in FIG. 4, the intermediate value V of the inverse quantized values W=0.00 and 1.00 corresponding to the quantized values Z=0 and 1 is 0.50, and the border value of the value Y before the quantization which the quantized values Z=0 and 1 may respectively take is 0.50. Also, the intermediate value V of the inverse quantized values W=1.00 and 2.52 corresponding to the quantized values Z=1 and 2 is 1.76, and the border value of the value Y before the quantization which the quantized values Z=1 and 2 may respectively take is 1.86. The intermediate value V of the inverse quantized values W=2.52 and 4.33 corresponding to the quantized values Z=2 and 3 is 3.43, and the border value of the value Y before the quantization which the quantized values Z=2 and 3 may respectively take is 3.57. After that, similarly, the obtained intermediate value V of the inverse quantized values W and the border value in the range of the value Y before the quantization which may take the quantized value Z are substantially the same value.

That is, in the case of the relation shown in FIG. 4, the range of the value Y before the quantization corresponding to the quantized value Z can be represented by the intermediate value V of the inverse quantized values W corresponding to the quantized values Z.

Configuration Example of the Quantization Unit

Next, with respect to the block diagram of FIG. 5, a configuration example of the quantization unit 32 will be described.

Figure 5:
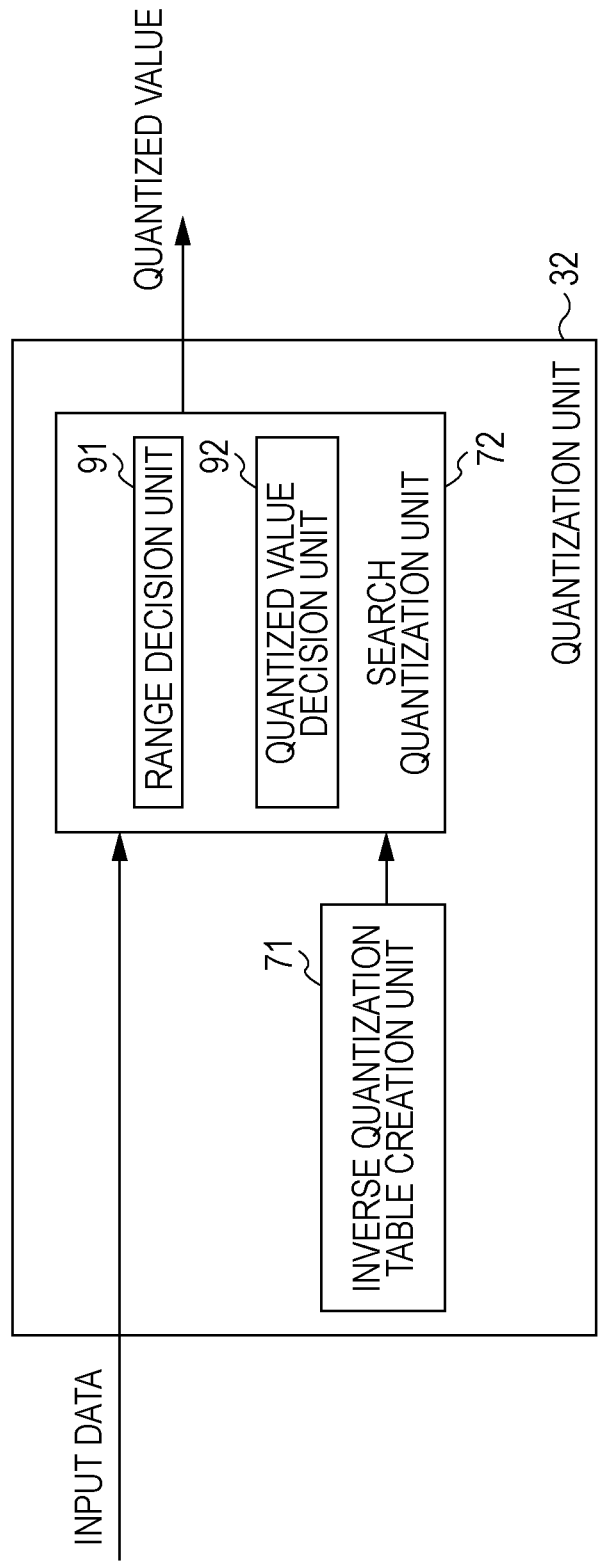
FIG. 5 is a block diagram of a configuration example of a quantization unit in the audio coding apparatus of FIG. 1.

The quantization unit 32 of FIG. 5 is composed of an inverse quantization table creation unit 71 and a search quantization unit 72 and outputs the quantized value Z on the basis of the input data X serving as the audio signal from the normalization coefficient unit 31.

The inverse quantization table creation unit 71 calculates the inverse quantized values W corresponding to the quantized values Z and creates the inverse quantization table in which the quantized values Z correspond to the inverse quantized values W to be supplied to the search quantization unit 72. To be more specific, the inverse quantization table creation unit 71 performs the calculation represented by Expression (2) described above to calculate the inverse quantized value W which is the discrete value corresponding to the quantized value Z(integer value). That is, the inverse quantization table creation unit 71 calculates the inverse quantized values W respectively corresponding to the integers in the range of $0 \leq Z \leq 8192$.

On the basis of the inverse quantization table supplied from the inverse quantization table creation unit 71, the search quantization unit 72 decides in which range the value Y before the quantization corresponding to the input data X supplied from the normalization coefficient unit 31 is included among the ranges where the inverse quantized values W adjacent in the inverse quantization table are set as the border values and supplies the quantized value Z corresponding to the relevant range to the Huffman coding unit 33.

The search quantization unit 72 is provided with a range decision unit 91 and a quantized value decision unit 92.

When the input data X from the normalization coefficient unit 31 is input, the range decision unit 91 decides in which range the value Y before the quantization corresponding to the input data X is included among the ranges where the inverse quantized values W adjacent in the inverse conversion table are set as the border values.

The quantized value decision unit 92 decides the quantized value Z corresponding to the inverse quantized value W whose value is close to the value Y before the quantization among the inverse quantized values W serving as the border values of the range decided by the range decision unit 91.

With the above-mentioned configuration, on the basis of the inverse quantized values in the previously created inverse quantization table, the quantization unit 32 searches for the quantized value corresponding to the value before the quantization obtained from the input data and outputs the quantized value.

Figure 6:
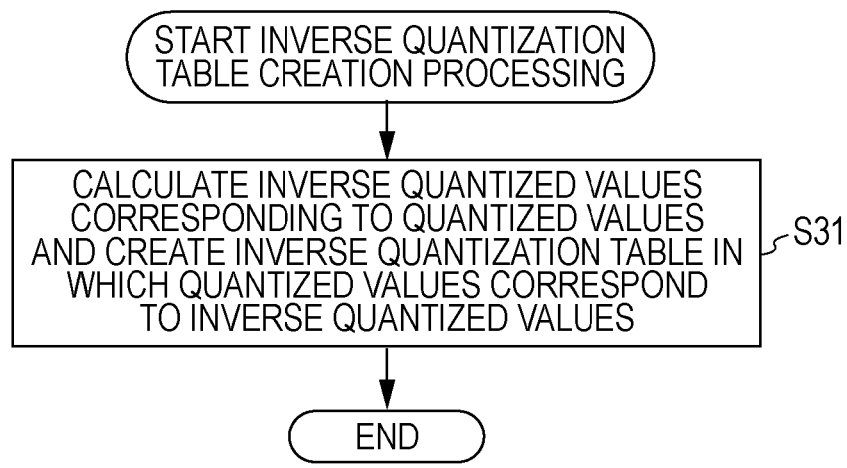
FIG. 6 is a flow chart for describing an inverse quantization table creation processing by the quantization unit of FIG. 5.

Next, with reference to a flow chart of FIG. 6, an inverse quantization table creation processing by the quantization unit 32 of FIG. 5 will be described. In the quantization unit 32, the inverse quantization table creation processing is carried out before the quantization processing is performed.

In step S31, the inverse quantization table creation unit 71 calculates the inverse quantized values W corresponding to the quantized values Z and creates the inverse quantization table in which the quantized values Z correspond to the inverse quantized values W to be supplied to the search quantization unit 72. To be more specific, the inverse quantization table creation unit 71 performs the calculation represented by Expression (2) to calculate the inverse quantized value W[s] (s=0, . . . , 8192) corresponding to the quantized value Z=0, . . . , 8192 and creates the inverse quantization table shown in FIG. 3.

As the result of the above-mentioned processing, before the quantization processing is performed, it is possible to create the inverse quantization table in which the inverse quantized values W correspond to the quantized values Z.

Quantization Processing by the Quantization Unit

Next, with reference to a flow chart of FIG. 7, the quantization processing by the quantization unit 32 of FIG. 5 will be described.

In step S61, when the input data X from the normalization coefficient unit 31 is input, the range decision unit 91 decides in which range the value Y before the quantization corresponding to the input data X is included among the ranges where the inverse quantized values adjacent in the inverse quantization table are set as the border values. To be more specific, the range decision unit 91 decides a range $W[k-1] \leq Y[m] < W[k]$ in which the inverse quantized values including the value Y[m] before the quantization are set as border values. At this time, m denotes the number of input data (identifier), which takes a value of 0 to data_size. Also, k−1 and k are equivalent to the quantized value Z, which take values of $1 \leq k \leq 8192$. For example, when the value Y before the quantization is 0.80, on the basis of the inverse quantization table of FIG. 3, the range decision unit 91 decides the range of $0.00 \leq Y[m] < 1.00$. In addition, when the value Y before the quantization is 8.26, on the basis of the inverse quantization table of FIG. 3, the range decision unit 91 decides the range of $6.35 \leq Y[m] < 8.55$.

In step S62, the quantized value decision unit 92 decides the quantized value Z corresponding to the inverse quantized value W whose value is close to the value Y before the quantization among the inverse quantized values serving as the border values of the range decided by the range decision unit 91 to be supplied to the Huffman coding unit 33, and the processing advances to step S63. That is, in the range $W[k-1] \leq Y[m] < W[k]$ including the value Y[m] before the quantization decided by the range decision unit 91, when $Y[m]-W[k-1] \leq W[k]-Y[m]$ is established, the quantized value decision unit 92 sets the quantized value Z[m]=k−1, and when $Y[m]-W[k-1] \leq W[k]-Y[m]$ is not established (when $Y[m]-W[k-1] > W[k]-Y[m]$ is established), the quantized value decision unit 92 sets the quantized value Z[m]=k. For example, when the value Y before the quantization is 0.80 and the range decided by the range decision unit 91 is $0.00 \leq Y[m] < 1.00$, on the basis of FIG. 4, the quantized value decision unit 92 decides the quantized value Z=1 corresponding to the inverse quantized value W=1.00. Also, when the value Y before the quantization is 8.26 and the range decided by the range decision unit 91 is $6.35 \leq Y[m] < 8.55$, on the basis of FIG. 4, the quantized value decision unit 92 decides the quantized value Z=5 corresponding to the inverse quantized value W=8.55.

Figure 7:
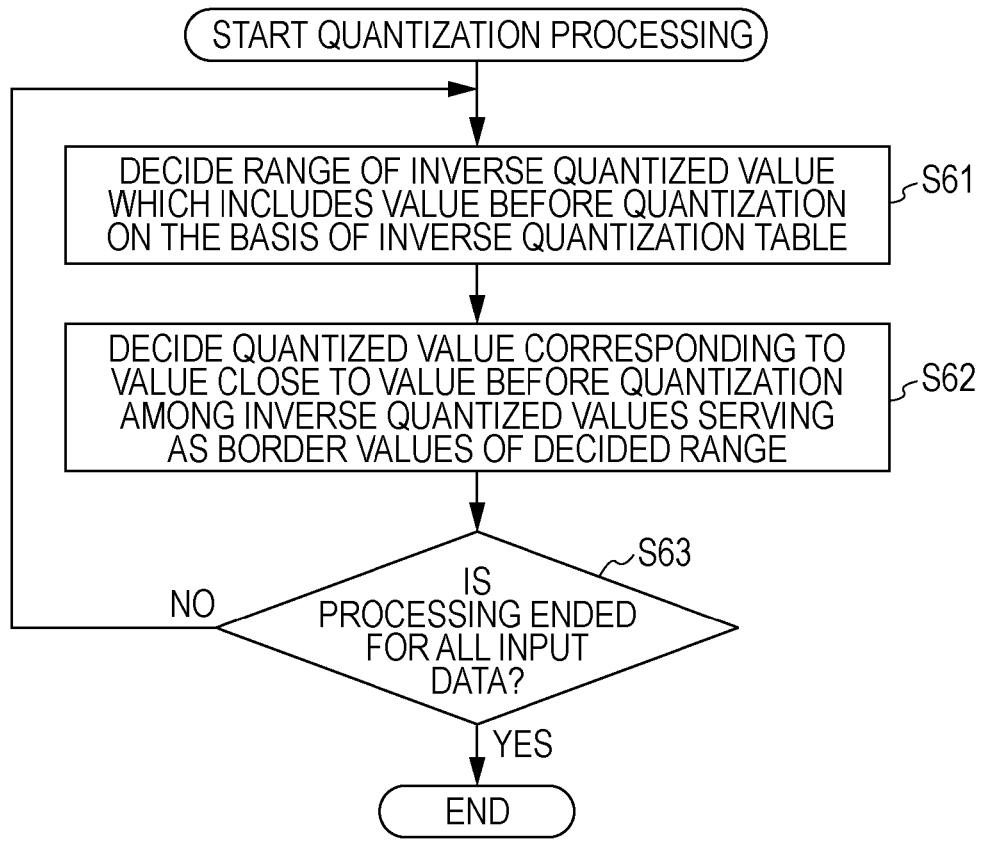
FIG. 7 is a flow chart for describing a quantization processing by the quantization unit of FIG. 5.

FIG. 8 shows a program example describing the processing in steps S61 and S62 in the flow chart of FIG. 7 in C language.

In a program 81 of FIG. 8, numerals at the left end of the respective lines denote the line number for the respective lines, which are provided for the description. That is, the numerals are not substantial for the actual description. Hereinafter, the same applies in other program examples.

Line 1 in the program 81 defines that m representing the identifier of the input data is incremented one each from 0 to data_size, and the following processing is repeatedly performed.

On lines 2 and 3 in the program 81, it is determined whether or not the value Y[m] before the quantization which is input at the m-th is smaller than the inverse quantized value W[1] on the basis of the inverse quantization table of FIG. 3. In a case where the value Y[m] before the quantization is smaller than the inverse quantized value W[1], for the parameter k, k=1 is assigned.

On the other hand, in a case where the value Y[m] before the quantization is not smaller than the inverse quantized value W[1], on lines 5 and 6, it is determined whether or not the value Y[m] before the quantization which is input at the m-th is smaller than the inverse quantized value W[2]. In a case where the value Y[m] before the quantization is smaller than the inverse quantized value W[2], for the parameter k, k=2 is assigned.

After that, in a similar manner, up to line N−8, the range where the value Y[m] before the quantization is included is decided on the basis of the inverse quantized values in the inverse quantization table (processing in step S61).

Then, on line N−2, in the range $W[k-1] \leq Y[m] < W[k]$ where the value Y[m] before the quantization is included which is decided in the processing on lines 2 to N−8, in the case of $Y[m]-W[k-1] \leq W[k]-Y[m]$, the quantized value $Z[m]=k-1$ is decided, and in the case of $Y[m]-W[k-1] > W[k]-Y[m]$, the quantized value $Z[m]=k$ is decided (processing in step S62).

It should be noted that in a case where the parameter k is decided as k=8192, as the quantized value Z[m] corresponding to W[8192] does not exist (as described above, as the range of the quantized value Z is $0 \leq Z \leq 8191$), the quantized value Z[m]=8191 is decided.

While referring back to the flow chart of FIG. 7, in step S63, the search quantization unit 72 determines whether or not the processing of searching for the quantized value Z is ended with respect to all the input data of the data_size pieces. In a case where the processing of searching for the quantized value Z is not ended with respect to all the input data, the processing is returned to step S61, until the processing is ended with respect to all the input data of the data_size pieces, the processing in step S61 to S63 is repeatedly performed.

As the result of the above-mentioned processing, by using the inverse quantization table representing the relation between the quantized values Z and the inverse quantized values W, it is possible to decide the quantized value Z corresponding to the value Y before the quantization which is calculated from the input data X. Therefore, without creating the quantization table which is based on the computation represented by Expression (1), it suffices that only the inverse quantization table having the 8193 table values which is about the half of the total number (16385) of the table values of the quantization table (FIG. 2) and the inverse quantization table (FIG. 3) is prepared. Thus, it is possible to reduce the memory capacity used for the processing.

Also, the value Y before the quantization is assigned as $Y=X/2^{q/4}$. Thus, without performing the computation of a power function of ¾ which is a nonlinear function represented by Expression (1), the quantized value Z can be decided, and it is possible to perform the nonlinear computation more efficiently.

In the above, the example of deciding the quantized value through the search among the 8193 conditions in turn has been described, but for example, if a binary search is used, the quantized value can be decided through the determination performed by 13 times.

Figure 9:
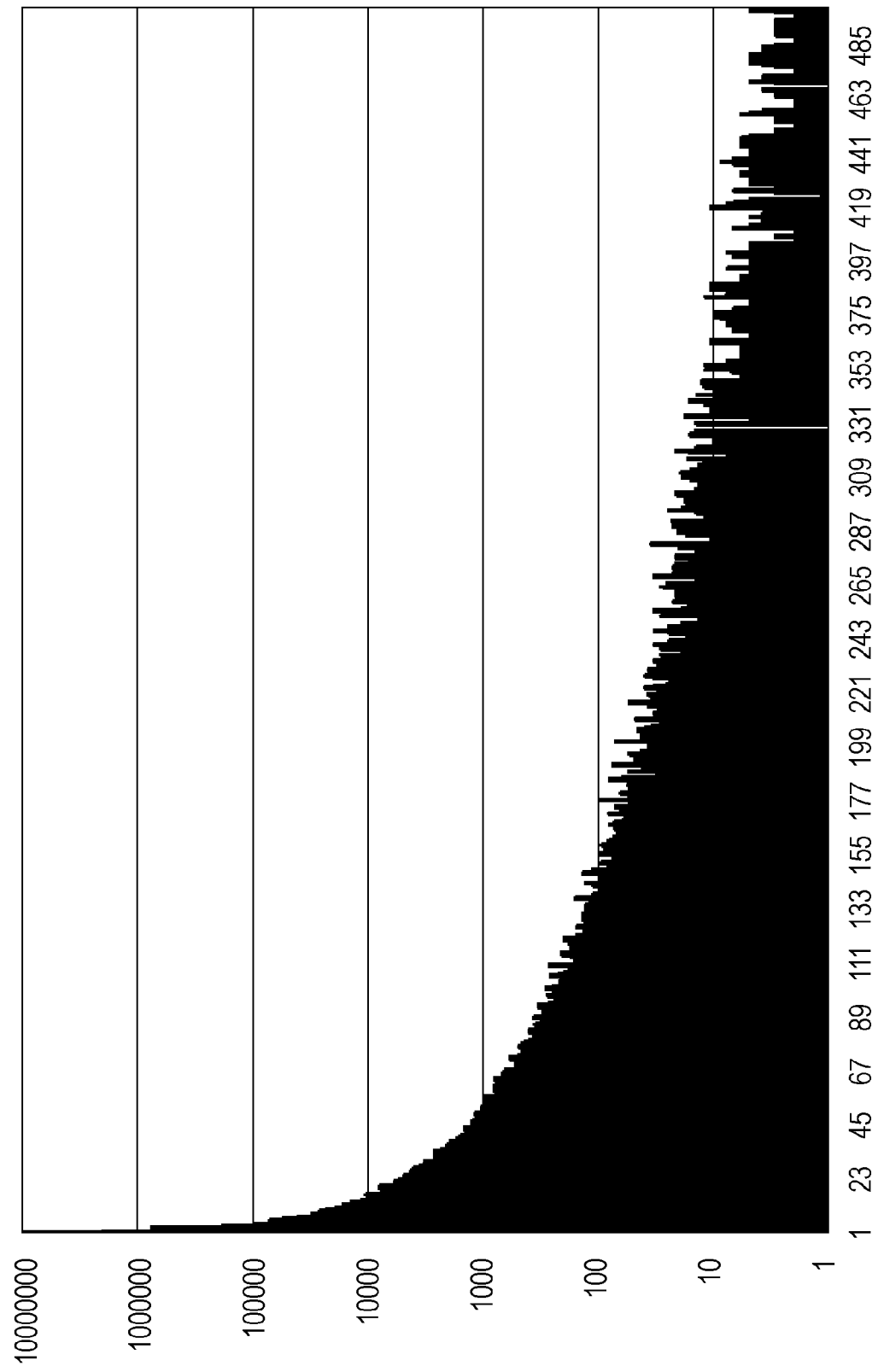
FIG. 9 is an explanatory diagram for describing a frequency of the quantization processing on the quantized value.

Incidentally, as shown in the histogram with respect to the quantized value Z of FIG. 9, as to the quantized value Z, the frequency of the quantization processing in which the quantized value of about Z<10 is obtained is high, and the frequency of the quantization processing in which the quantized value Z=0 is obtained is highest. Also, as the quantized value Z becomes larger, the frequency of the quantization processing in which the quantized value Z is obtained becomes lower. That is, FIG. 9 shows that as the quantized value Z is smaller, the number of times for the quantization processing in which the quantized value Z is obtained is larger. It should be noted that in FIG. 9, the horizontal axis represents the quantized value Z, and the vertical axis represents the frequency (number of times) of the quantization processing.

Hereinafter, the example of the quantization unit utilizing the tendency on the frequency of the quantization processing will be described.

2. Second Embodiment

Configuration Example of the Quantization Unit

Figure 10:
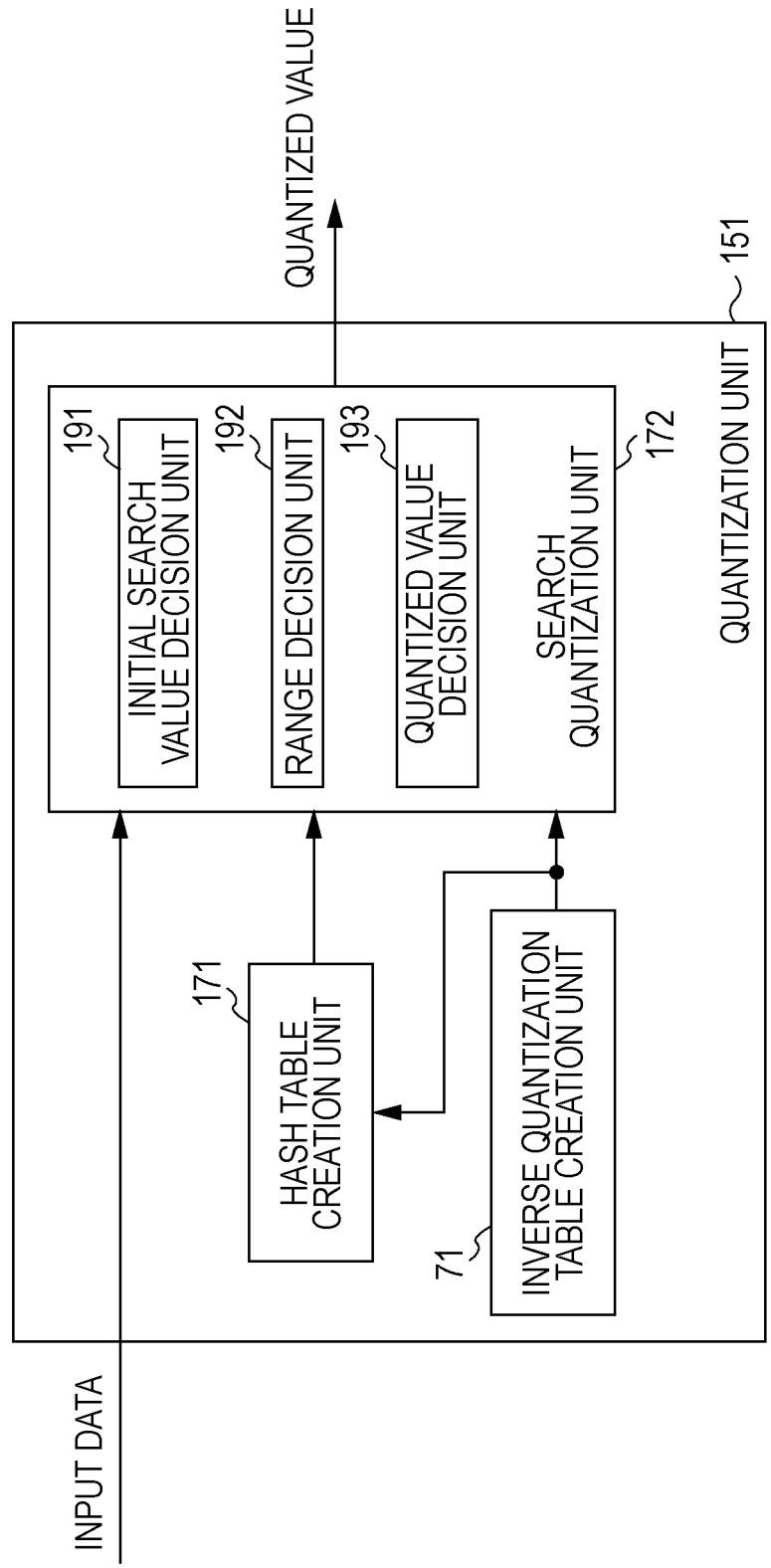
FIG. 10 is a block diagram of another configuration example of the quantization unit.

FIG. 10 shows a configuration example of the quantization unit which utilizes a tendency of the frequency of the quantization processing. It should be noted that in a quantization unit 151 of FIG. 10, a configuration having a similar function to that provided to the quantization unit 32 of FIG. 5 is assigned with the same name and the same symbol, and a description thereof is appropriately omitted.

That is, in a quantization unit 151 of FIG. 10, a difference from the quantization unit 32 of FIG. 5 resides in that a hash table creation unit 171 is newly provided, and instead of using the search quantization unit 72, a search quantization unit 172 is provided.

In a quantization unit 151 of FIG. 10, the inverse quantization table creation unit 71 supplies the created inverse quantization table to the hash table creation unit 171 and the search quantization unit 172.

The hash table creation unit 171 creates a hash table on the basis of the inverse quantization table from the inverse quantization table creation unit 71 and supplies the hash table to the search quantization unit 172.

Herein, the hash table refers to a table in which the ranges decided by the inverse quantized values which are the table values in the inverse quantization table are divided into groups in accordance with the values before the quantization, and information representing the relevant group is set as a table value. That is, according to the hash table, when the value before the quantization is input, the group corresponding to the value before the quantization is decided, and in the group, a search for an initial search value which is a table value that should be searched for first is started. Therefore, it is possible to search for the table value faster than the sequential search with respect to all the table values defined by the inverse quantization table. It should be noted that a detail of the hash table creation will be described below.

The search quantization unit 172 is provided with an initial search value decision unit 191, a range decision unit 192, and a quantized value decision unit 193. The initial search value decision unit 191 uses the hash table supplied from the hash table creation unit 171 to decide the value of the search start (the initial search value) in the inverse quantization table. On the basis of the hash table supplied from the hash table creation unit 171 and the inverse quantization table supplied from the inverse quantization table creation unit 71, the range decision unit 192 searches for in which range the value Y before the quantization calculated from the input data X from the normalization coefficient unit 31 is included among the ranges where the inverse quantized values W adjacent in the inverse quantization table are set as the border values from the initial search value decided by the initial search value decision unit 191. The quantized value decision unit 193 decides the quantized value Z corresponding to the inverse quantized value W whose value is close to the value Y before the quantization among the inverse quantized values W serving as the border values of the range decided by the range decision unit 192 and supplies the quantized value Z to the Huffman coding unit 33.

With the above-mentioned configuration, on the basis of the previously created inverse quantization table and the hash table, the quantization unit 151 searches for the quantized value corresponding to the value before the quantization obtained from the input data and outputs the quantized value.

Hash Table Creation Processing by the Quantization Unit

Figure 11:
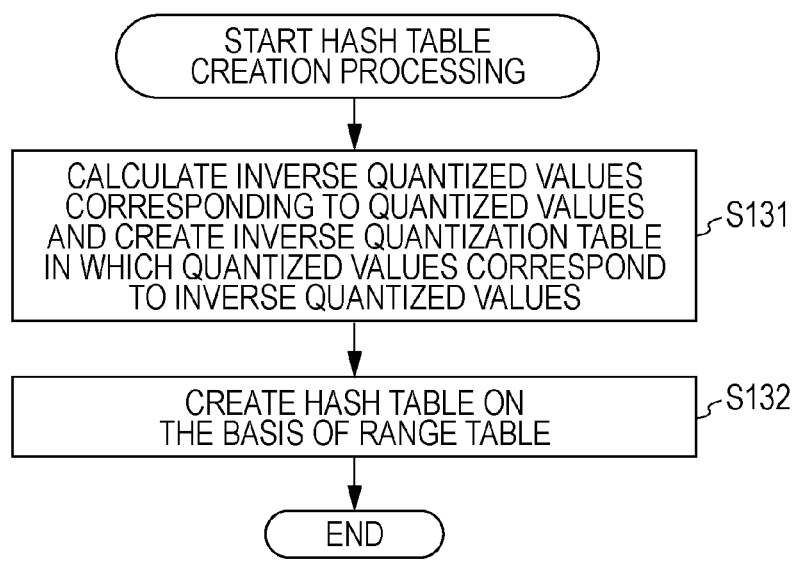
FIG. 11 is a flow chart for describing a hash table creation processing by the quantization unit of FIG. 10.

Next, with reference to a flow chart of FIG. 11, a hash table creation processing by the quantization unit 151 of FIG. 10 will be described. In the quantization unit 151, the hash table creation processing is performed before performing the quantization processing. It should be noted that the processing in step S131 in the flow chart of FIG. 11 is similar to the inverse quantization table creation processing described with reference to the flow chart of FIG. 6, and a description thereof will be omitted.

That is, in step s132, the hash table creation unit 171 creates the hash table on the basis of the inverse quantization table from the inverse quantization table creation unit 71 and supplies the hash table to the search quantization unit 172.

To be more specific, for example, the hash table creation unit 171 uses an exponent part and a significand part of the floating point number based on IEEE (Institute for Electrical and Electronics Engineering) 754 to create the hash table.

Figure 12:
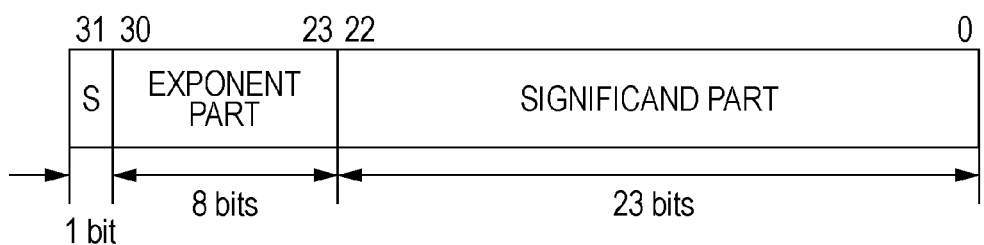
FIG. 12 is an explanatory diagram for describing floating point type data.

The floating point type data representing the single-precision floating point number based on the IEEE754 standard is constructed of a bit string of 32 bits as shown in FIG. 12. That is, a part from the 0-th bit to the 22nd bit which are the least significant bits of data on the floating point number is set as a significand F of the significand part, a part from the 23rd bit to the 30th bit is set as an exponent E of the exponent part, and a part at the 31st bit which is the most significant bit is set as a code bit S.

At this time, in a case where the significand part is positive, the code bit S is "0", and in a case where the significand part is negative, the code bit S is "1". Also, the bit configuration of the exponent part is the "exponent+bias". For example, according to the standard of IEEE754, 127 is used as the single-precision bias. Thus, when the numeric value of the exponent is "0", the value of the exponent part is "127" (=0+127), and the exponent part has a bit configuration of 127 (0x7f) ("0x" represents that "7f" is hexadecimal).

It should be noted that the case in which the exponent part is 0 and 255 has a meaning of a special value, but a description thereof will be omitted.

When the value represented by the above-mentioned floating point type data is represented by a numerical representation format, the value is as shown in Expression (3).

[Expression 3]

$$(-1)^S \times 2^{(E-B)} \times (1+.F) \quad (3)$$

It should be noted that in Expression (3), ".F" represents that the significand part is subjected to the decimal representation as the decimal point exists before the significant bit of the significand F. Also, "B" in Expression (3) represents a bias component, and "S" represents a code bit.

Next, an example of the hash table creation procedure using the exponent part and the significand part of the floating point number described above will be described.

The hash table creation unit 171 subtracts 125 from the value of the exponent part of the 8 bits as to the exponent part and set the value as index1. In this case, the range where the quantized value Z=0 is established is $0 \leq Y < 0.4999600$, $0.25 \leq 0.4999600 < 0.5$ is satisfied, and in the interval of 0.25 to 0.5, the value of the exponent part is 125. Thus, the subtraction value of the exponent part is set as 125. Also, the range where the quantized value Z=8191 is established is $1.6512946 \times 10^5 \leq Y$, the exponent part when $1.6512946 \times 10^5$ is represented by the single-precision floating point number is 144. This index1 takes a value of 0 to 19.

Also, the hash table creation unit 171 sets four significant bits of the significand part of the 23 bits as index2 as to the significand part. This index2 takes a value of 0 to 15.

With respect to the hash table functioning as a two-dimensional array in which index1 and index2 are set as element counts, the hash table creation unit 171 takes out the exponent part and the significand part from 8193 pieces of values in the inverse conversion table to be arranged in the hash table (two-dimensional array) while index of the inverse quantization table in which one value of index1 and index2 is changed is set as an element.

The procedure of the hash table creation will be described while using the inverse quantization table W[8193] of FIG. 15 which will be described below. W[1]=1.0000000 of the index 1 takes index1=2 and index2=0, W[2]=2.5198421 of the index 2 takes index1=3 and index2=4. As a result, the range where the quantized value Z=1 or 2 is established is $1.0000000 \leq Y < 2.5198421$, and therefore the combination of index1 and index2 for the value Y before the quantization in this interval is index1=2 and index2=0 to 15, or index1=3 and index2=0 to 3. In the hash table of these index1 and index2, the index 1 of the inverse quantization table is arranged. Similarly, W[2]=2.5198421 of the index 2 takes index1=3 and index2=4, and W[3]=4.3267488 of the index 3 takes index1=4 and index2=1. As a result, the range where the quantized value Z=2 or 3 is established is $2.5198421 \leq Y < 4.3267488$, and therefore the combination of index3 and index2 for the value Y before the quantization is index3=3 and index2=4 to 15, or index3=4 and index2=0. In the hash table of these index1 and index2, the index 2 of the inverse quantization table is arranged.

FIG. 13 shows an example of the hash table dequantize_hash[index1][index2] created in the above-mentioned procedure described in C language on the basis of the inverse quantization table W[8193] of FIG. 15 which will be described below.

In a program 201 of FIG. 13, dequantize_hash[20][16] described on lines 1 to N respesents a two-dimensional array of 20×16.

For example, on lines 3 and 4, table values of index1=0 and index2=0 to 16 are described. On lines 6 and 7, table values of index1=1 and index2=0 to 16 are described. After that, table values are described in a similar manner, and on lines N−3 and N−2, table values of index1=19 and index2=0 to 16 are described.

As shown in the program 201 of FIG. 13, when the exponent part and the significand part are used for the hash table, as table values (elements) in the hash table, many of values with the small quantized values are allocated.

In particular, in a case where index1=8 or lower is established on lines 3 to 28, the difference with the adjacent value is only 1. Thus, in the quantization processing which will be described below, the quantized value Z can be decided through the search performed only once for the value Y before the quantization with index1=8 or lower.

Also, in a case where the above-mentioned hash table is used, for example, when index1=18 and index2=0 are established, the difference of the table value 4096 at this time and the next table value 4287 (range of the values before the quantization) is 191, and the search is to be performed by 191 times. However, as shown in FIG. 9, as the quantized value in the vicinity of this table value is hardly generated, there is no problem even when the number of the searches becomes large.

As the result of the above-mentioned processing, before the quantization processing is performed, it is possible to create the hash table in which the search for the table value in the inverse quantization table is promptly performed.

Quantization Processing by the Quantization Unit

Next, with reference to a flow chart of FIG. 14, the quantization processing of FIG. 10 by the quantization unit 151 will be described.

In step S161, when the input data X from the normalization coefficient unit 31 is input, the range decision unit 192 decides in which range the value Y before the quantization corresponding to the input data X is included among the predetermined ranges in the ranges where the inverse quantized values W adjacent in the inverse conversion table are set as border values. To be more specific, the range decision unit 192 calculates the value Y before the quantization=$X/2^{q/4}$ from the input data X from the normalization coefficient unit 31 and searches for a range which includes the value Y before the quantization among the ranges where the inverse quantized values W adjacent in the inverse conversion table are set as the border values by the predetermined times by using the conditional sentence.

In step S162, the range decision unit 192 determines whether or not the range of the inverse quantized value which includes the value Y before the quantization is obtained in the processing in step S161. That is, the range decision unit 192 determines whether or not the range which includes the value Y before the quantization is decided through the search performed by the predetermined times by using the conditional sentence.

In step S162, in a case where the range which includes the value Y before the quantization is decided through the search performed by the predetermined times by using the conditional sentence, the processing advances to step S163.

In step S163, the quantized value decision unit 193 decides the quantized value Z corresponding to the inverse quantized value W whose value is close to the value Y before the quantization among the inverse quantized values serving as the border values of the range decided by the range decision unit 192 and supplies the quantized value Z to the Huffman coding unit 33, and the processing advances to step S167.

On the other hand, in step S162, in a case where the range which includes the value Y before the quantization is not decided through the search performed by the predetermined times, the processing advances to step S164.

In step S164, the initial search value decision unit 191 uses the hash table supplied from the hash table creation unit 171 to decide the initial search value in the inverse quantization table. To be more specific, the search quantization unit 172 calculates the value Y before the quantization=$X/2^{q/a}$ from the input data X from the normalization coefficient unit 31, and calculates index1 and index2 on the basis of the exponent part and the significand part of the value Y before the quantization thus calculated to obtain the initial search value in the inverse quantization table from the hash table.

In step S165, on the basis of the initial search value and the inverse quantization table supplied from the inverse quantization table creation unit 71, the range decision unit 192 searches for and decides the range W[k−1]≤Y[m]<W[k] which includes the value Y before the quantization corresponding to the input data X in which the inverse quantized values W are set as the border values.

In step S166, the quantized value decision unit 193 decides the quantized value Z corresponding to the inverse quantized value W whose value is close to the value Y before the quantization among the inverse quantized values W serving as the border values of the range decided by the range decision unit 192. To be more specific, in the range W[k−1]≤Y[m]<W[k] decided by the range decision unit 192 which includes the value Y[m] before the quantization, when Y[m]−W[k−1]≤W[k]−Y[m] is established, the quantized value decision unit 193 sets the quantized value Z[m]=k−1, and when Y[m]−W[k−1]≤W[k]−Y[m] is not established, the quantized value decision unit 193 sets the quantized value Z[m]=k. The quantized value decision unit 193 supplies the decided quantized value Z to the Huffman coding unit 33.

In step S167, the search quantization unit 172 determines whether or not the processing of searching for the range which includes the value Y before the quantization is ended with respect to all the data_size pieces of the input data. In a case where it is determined that the processing of searching for the range which includes the value Y before the quantization is not ended with respect to all the input data, the processing is returned to step S161, and until the processing is ended with respect to all the input data of the data_size pieces, the processing in steps S161 to S167 is repeatedly performed.

Figure 14:
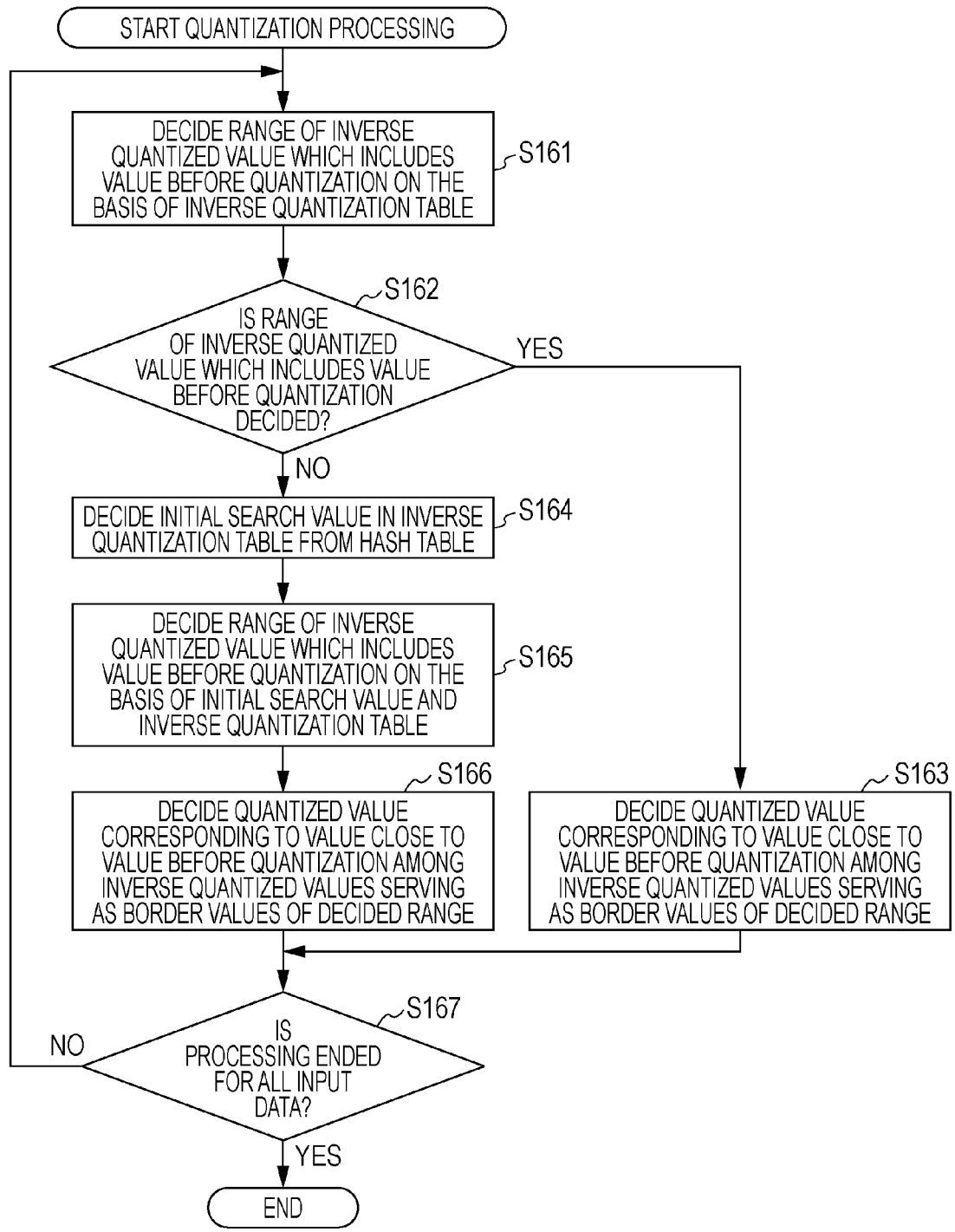
FIG. 14 is a flow chart for describing the quantization processing by the quantization unit of FIG. 10.

FIG. 15 shows an example of the program describing the processing in steps S161 to S167 in the flow chart of FIG. 14 in C language.

In the program 211 of FIG. 15, W[8193] on lines 1 to 8195 represents the inverse quantization table.

Lines 8197 to 8200 define that the value uni0 is used as data of a different type. Also, line 8201 in the program 211 defines that m representing the identifier of the input data is incremented one each from 0 to data_size, and the following processing is repeatedly performed.

On lines 8203 to 8213, the range in which the value Y[m] before the quantization (=uni0.f) is included is searched for in turn by four times on the basis of the conditional sentence, and the parameter k is decided (processing in step S161).

Also, on lines 8216 to 8218, by using the hash table dequantize_hash[index1][index2] described in FIG. 13, the initial search value of the value Y[m] before the quantization (=uni0.f) is decided (processing in step S164).

Furthermore, on lines 8219 and 8220, on the basis of the initial search value k and the inverse quantization table W[k], the range in which the value Y[m] before the quantization (=uni0.f) is included is searched for (decided), and the parameter k is decided (processing in step S165).

Then, on line 8228, in the range W[k−1]≤Y[m]<W[k] in which the value Y[m] before the quantization is included which is decided through the processing on lines 8216 to 8220, when Y[m]−W[k−1]≤W[k]−Y[m] is established, the quantized value Z[m]=k−1 is decided, and when Y[m]−W[k−

1]≤W[k]−Y[m] is not established, the quantized value Z[m]=k is decided (processing in steps S163 and S166).

In this manner, in a case where the value before the quantization is large, the initial search value is decided on the basis of the hash table. Thus, the range in which the value before the quantization is included is searched for more promptly than the program 81 of FIG. 8 where the values are searched for sequentially from the smaller values.

As the result of the above-mentioned processing, by using the inverse quantization table representing the relation between the quantized values Z and the inverse quantized values W, it is possible to decide the quantized value Z corresponding to the value Y before the quantization which is calculated from the input data X. Therefore, without creating the quantization table which is based on the computation represented by Expression (1), it suffices that only the inverse quantization table having 8193 pieces of table values which is about half of the total number of table values for the quantization table and the inverse quantization table (16385) is prepared. Therefore, it is possible to reduce the memory capacity used for the processing.

Also, as the value Y before the quantization is given by $Y=X/2^{q/4}$, it is possible to decide the quantized value Z without computing the power function of ¾ which is the nonlinear function shown in Expression (1) and also through the search performed by the still smaller times on the basis of the hash table. Thus, it is possible to output the computation result of the nonlinear computation more efficiently and also more promptly.

It should be noted that in the above description, the quantized value Z is obtained by using the conditional sentence determination based on the inverse quantization table and the decision of the initial search value based on the hash table in combination, but the quantized value Z may be obtained by only using the decision of the initial search value based on the hash table.

Also, in the above-mentioned method using the conditional sentence determination based on the inverse quantization table and the decision of the initial search value based on the hash table in combination, the inverse quantized values in the inverse quantization table are used for the conditional sentence, but the intermediate value of the inverse quantized values may also be used.

FIG. 16 shows an example of the program describing the processing in a case where the intermediate value of the inverse quantized values is used for the conditional sentence in the program 211 of FIG. 15 in C language.

In a program 221 of FIG. 16, the inverse quantization table W[8193] on lines 1 to 8195 in the program 211 of FIG. 15 is omitted.

Also, a difference between the program 221 of FIG. 16 and the program 211 of FIG. 15 resides when the range in which the value Y[m] before the quantization (=uni0.f) is included is decided in that the processing on lines 7 to 23, the quantized value Z[m] is also decided. This is because in the relation described with reference to FIG. 4, the border values of the range of the value Y before the quantization are substantial same as the range of the intermediate value V of the inverse quantized values W.

In this manner, as to the quantized value obtained through the quantization processing with the high frequency, by using the intermediate value of the inverse quantized values for the conditional sentence, it is possible to decide the quantized value Z corresponding to the value Y before the quantization which is calculated from the input data X. Therefore, as to the quantized value obtained through the quantization processing with the high frequency, it is not determined whether the range W[k] in which the value Y[m] before the quantization is included is Y[m]−W[k−1]≤W[k]−Y[m] or not, and it is therefore possible to perform the nonlinear computation more efficiently and also more promptly.

Application Example in the Fixed-Point Number

In the above description, the value before the quantization and the values in the inverse quantization table are treated as the floating point numbers, but those values can also be treated as the fixed-point numbers. To be more specific, the range of the inverse quantized value corresponding to the quantized value is calculated by way of the floating point number, and on the basis of the floating point number, an integer part of the fixed-point number may be calculated.

Hereinafter, an example using the inverse quantization table and the hash table in combination will be described in the above-mentioned case in which with respect to the inverse quantization table W[8193] represented by the floating point number, the position of the decimal point is provided at the 8th bit among the 32 bits to be set as the fixed-point number. As the position of the decimal point is at the 8th bit, the range table value is created by multiplying by 256 and taking only the integer part.

First, the calculation for index1 and index2 in the hash table by the initial search value decision unit 191 is performed by the following procedure.

That is, in the value Y before the quantization, a position cnt of the most significant bit where 1 is turned on is searched for, and index1 is calculated by Expression (4).

[Expression 4]

$$\text{index1}=cnt-P+2 \qquad (4)$$

In Expression (4), P represents the position of the decimal point, and in this case, P=8 is established. Also, "2" in Expression (4) is a difference between 125 functions as the reference for the exponent part at the time of the creation for the hash table of the floating point number and the bias 127 defined by the standard of IEEE754.

Also, as shown in Expression (5) and Expression (6), in the value Y before the quantization, index2 is calculated while the most significant bit where 1 is turned on is turned into 0, and the shift is carried out on the right by cnt-4.

[Expression 5]

$$Y=Y-\text{mask} \qquad (5)$$

$$\text{index2}=Y\!\!>\!\!>\!(cnt-P) \qquad (6)$$

It should be noted that "mask" in Expression (5) is hexadecimal, starts from "0x40000000" ("100 0000 0000 0000 0000 0000 0000 0000" in the binary digit (32 bits)), and is subjected to a right shift computation by one bit each up to the most significant bit where 1 is turned on with respect to the value Y before the quantization. Eventually, "mask" becomes a value representing the most significant bit where 1 is turned on with respect to the value Y before the quantization. That is, through the subtraction in Expression (5), the most significant bit where 1 is turned on is set as 0. ">>" in Expression (6) represents the right shift computation.

FIG. 17 shows an example of a program describing a case in which the value of the floating point number in the inverse quantization table W[8193] explained with reference to FIG. 16 is set as the fixed-point number where the position of the decimal point is at the 8th bit among the 32 bits in C language.

In a program 231 of FIG. 17, Wint[8193] on lines 1 to 8195 represents the inverse quantization table converted into the fixed-point numbers.

Line 8197 defines an integer type value yin. Also, line 8198 in the program 81 defines that m representing the identifier of the input data is incremented one each from 0 to data_size, and the following processing is repeatedly performed.

The processing on lines 8200 to 8216 corresponds to the processing in step S162 in the flow chart of FIG. 14. The range of the intermediate value V which includes the value Y[m] before the quantization (=yin) converted into the fixed-point number where the position of the decimal point is at the 8th bit among the 32 bits is searched for by six times, and the quantized value Z[m] is decided.

The processing on lines 8219 to 8226 is a processing equivalent to the computation in Expressions (4) to (6) described above.

Also, on lines 8227 to 8229, by using the hash table dequantize_hash[index1][index2] described with reference to FIG. 13, the initial search value for the value Y[m] before the quantization (=yin) is decided (processing in step S164).

Furthermore, on lines 8230 and 8231, on the basis of the initial search value k and the inverse quantization table Wint [k], the range which includes the value Y[m] before the quantization (=yin) is searched for (decided), and the parameter k is decided (processing in step S165).

Then, on line 8239, in the range W[k−1]≤Y[m]<W[k] which includes the value Y[m] before the quantization decided in the processing on lines 8227 to 8231, when Y[m]−W[k−1]≤W[k]−Y[m] is established, the quantized value Z[m]=k−1 is decided, and when Y[m]−W[k−1]≤W[k]−Y[m] is not established, the quantized value Z[m]=k is decided (processing in step S166).

In this manner, without creating the quantization table, the quantized value can be decided through the search using the inverse quantization table composed of the fixed-point numbers and the hash table, and it is therefore possible to reduce the memory capacity used for the processing.

Execution Result

Figures 18, 19:
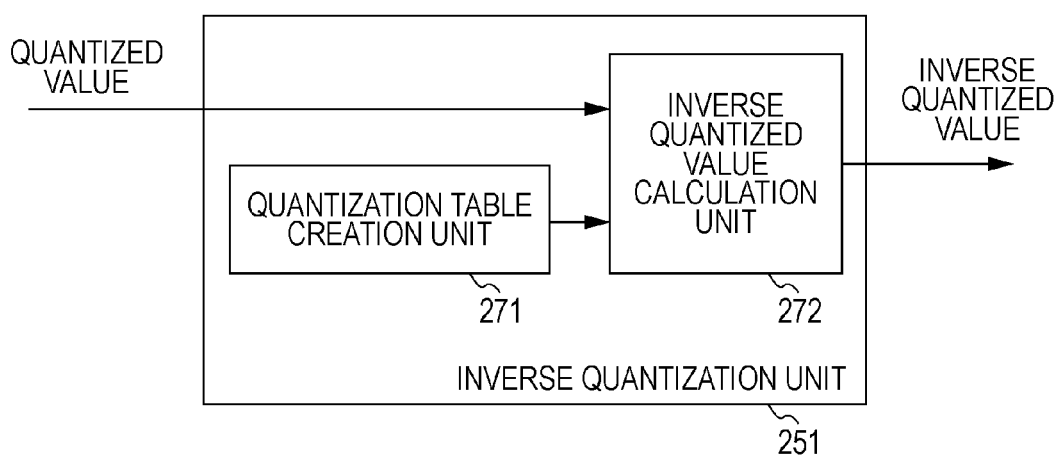
FIG. 18 is an explanatory diagram for describing the number of cycles when the quantization processing is applied.
FIG. 19 is a block diagram of a configuration example of an inverse quantization unit which performs an inverse quantization processing by using the quantization table.

Hereinafter, with reference to FIG. 18, the cycle number when the above-mentioned quantization processing is applied will be described. FIG. 18 shows the cycle numbers when the above-mentioned quantization processing is executed by using R4000 of MIPS Technologies, Inc. functioning as a RISC (Reduced Instruction Set Computer) CPU.

As shown in FIG. 18, while the cycle number when the quantization processing is executed by using the inverse quantization table (conditional sentence) is set as 1.00, the cycle number when the quantization processing (FIG. 14) using the conditional sentence and the hash table in combination is executed is 0.70, which leads to the efficiency improvement by 30% according to the embodiment of the present invention. Also, in the quantization processing (the program 221 of FIG. 16) using the conditional sentence and the hash table in combination, the cycle number when the intermediate value of the inverse quantized values is used for the conditional sentence is 0.45, which leads to the efficiency improvement by 55%.

3. Third Embodiment

In the above, the quantization processing using the inverse quantization table for performing the inverse quantization processing has been described, but on the basis of the relation described in FIG. 4, the inverse quantization processing can also be performed by using the quantization table for performing the quantization processing.

Configuration Example of the Inverse Quantization Unit

FIG. 19 shows a configuration example of an inverse quantization unit which carries out an inverse quantization processing by using the quantization table for performing the quantization processing.

An inverse quantization unit 251 of FIG. 19 performs, for example, the inverse quantization processing for an evaluation of the quantization error in the quantization processing by the quantization unit 32 of FIG. 1.

The inverse quantization unit 251 of FIG. 19 is composed of a quantization table creation unit 271 and an inverse quantized value calculation unit 272.

The quantization table creation unit 271 calculates the range of the value Y before the quantization corresponding to the quantized value Z, the quantization table in which the quantized values Z correspond to the ranges of the values Y before the quantization (FIG. 2) to be supplied to the inverse quantized value calculation unit 272. According to a more specific method of obtaining the range of the value Y before the quantization, the value Y before the quantization in Expression (7) is increased from a small value, and the value Y before the quantization when the value of the quantized value Z which is the discrete value is changed, that is, the value serving as the border is obtained.

[Expression 6]

$$Z = (int)(Y^{3/4} - 0.0946 + 0.5) \tag{7}$$

On the basis of the quantization table supplied from the quantization table creation unit 271, the inverse quantized value calculation unit 272 calculates the inverse quantized value W corresponding to the quantized value Z supplied from the quantization unit 32 and outputs the inverse quantized value W.

With the above-mentioned configuration, on the basis of the inverse quantization table, the inverse quantization unit 251 calculates the inverse quantized value corresponding to the quantized value input from the quantization unit (not shown) and outputs the inverse quantized value.

Quantization Table Creation Processing by the Inverse Quantization Unit

Figure 20:
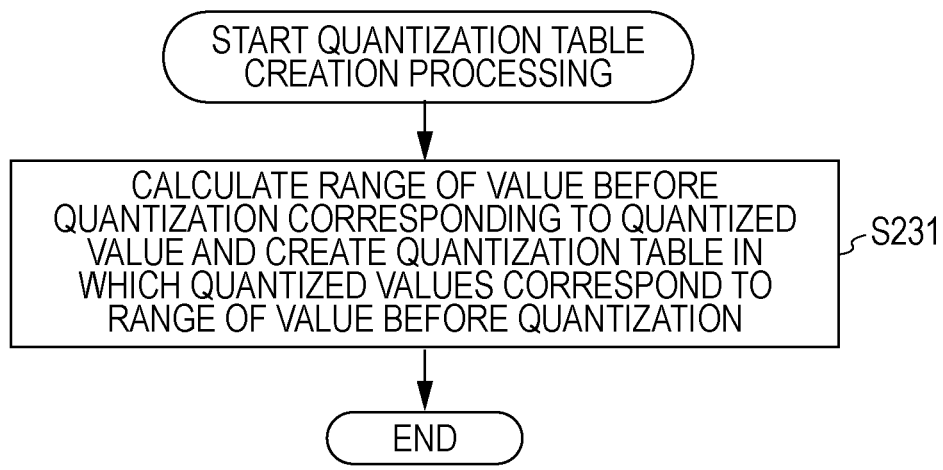
FIG. 20 is a flow chart for describing a quantization table creation processing by the inverse quantization unit of FIG. 19.

Next, with reference to a flow chart of FIG. 20, the quantization table creation processing by the inverse quantization unit 251 of FIG. 19 will be described. In the inverse quantization unit 251, the quantization table creation processing is carried out before the inverse quantization processing is performed.

In step S231, the quantization table creation unit 271 calculates the range of the value Y before the quantization corresponding to the quantized value Z, the quantization table in which the quantized values Z correspond to the ranges of the values Y before the quantization to be supplied to the inverse quantized value calculation unit 272. To be more specific, the quantization table creation unit 271 increases the value Y before the quantization in Expression (7) from a small value and obtains the value Y before the quantization when the value of the quantized value Z which is the discrete value is changed, that is the value serving as the border. That is, the quantization table creation unit 271 obtains the range of the value Y before the quantization [Z[m]] corresponding to 8193 pieces of the quantized values Z[m] (m=0, . . . , 8192).

As the result of the above-mentioned processing, before the inverse quantization processing is performed, it is possible to create the quantization table in which the quantized values Z correspond to the ranges of the values Y before the quantization (border values).

Inverse Quantization Processing by the Inverse Quantization Unit

Figure 21:
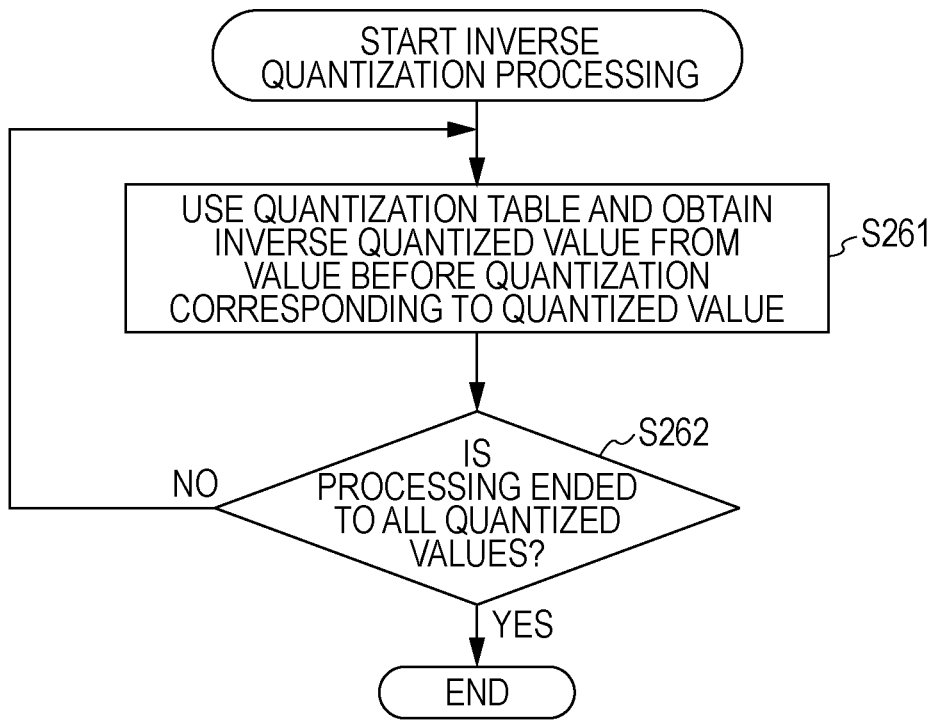
FIG. 21 is a flow chart for describing the inverse quantization processing of the inverse quantization unit of FIG. 19.

Next, with reference to a flow chart of FIG. 19, the inverse quantization processing by the inverse quantization unit 251 of FIG. 21 will be described.

In step S261, the inverse quantized value calculation unit 272 uses the quantization table supplied from the quantization table creation unit 271 to calculate the inverse quantized value W corresponding to the quantized value Z supplied from the quantization unit (not shown) and outputs the inverse quantized value W.

At this time, in FIG. 4, the intermediate value between the intermediate values V[m−1] and V[m] is substantially same as the inverse quantized value W[m]. Therefore, the inverse quantized value W[m] is substantially same as the intermediate value between the values Y before the quantization Y[m−1] and Y[m]. For example, in FIG. 4, the intermediate value between the intermediate values V[0]=0.50 and V[1]= 1.76 is 1.13, which is the value close to the inverse quantized value W[1]=1. Also, in FIG. 4, the intermediate value between the intermediate values V[1]=1.76 and V[2]=3.43 is 2.59, which is the value close to the inverse quantized value W[2]=2.52

In view of the above, the inverse quantized value calculation unit 272 performs the calculation represented by Expression (8) to calculate the inverse quantized value W[m] corresponding to the quantized value Z[m].

[Expression 7]

$$W[m]=(Y[Z[m]-1]+Y[Z[m]])/2 \quad (8)$$

In step S262, the inverse quantized value calculation unit 272 determines whether or not the processing of calculating the inverse quantized value W is ended with respect to all the data_size pieces of the quantized values Z. In a case where it is determined that the processing of calculating the inverse quantized value W is not ended with respect to all the quantized values Z, the processing is returned to step 261, and until the processing is ended with respect to all the data_size pieces of the quantized values Z, the processing in steps S261 and S262 is repeatedly performed.

As the result of the above-mentioned processing, by using the quantization table representing the relation between the quantized value Z and the range of the value Y before the quantization, it is possible to decide the inverse quantized value W corresponding to the input quantized value Z. Therefore, without creating the inverse quantization table, it suffices that only the quantization table having the 8193 table values which is about the half of the total number (16385) of the table values of the quantization table and the inverse quantization table is prepared, and it is therefore possible to reduce the memory capacity used for the processing.

4. Fourth Embodiment

In the above, the quantization processing in conformity to the AAC standard has been described, but also in the quantization processing in an MPEG-1 audio layer 3 (MP3) which is standardized by ISO/IEC11172-3, the quantization and inverse quantization processing similar to Expression (1) and Expression (2) is performed. Thus, also in the quantization and inverse quantization processing in the MP3, the embodiment of the present invention can be applied.

Also, in the above, the power function used as the nonlinear function in the quantization processing in conformity to the AAC standard has been described as an example. However, as shown in Expression (9) and Expression (10), the corresponding relation between a predetermined function func(X) with respect to the input value X and an inverse function thereof inv_func(Y) is apparent, and in a case where one of the input values is a discrete value, the embodiment of the present invention can be applied.

[Expression 8]

$$Y=(int)\text{func}(X) \quad (9)$$

$$W=inv\_\text{func}(Y) \quad (10)$$

Furthermore, in the above description, the inverse quantization table is previously calculated. However, for example, during the processing, in a case where the table values in the inverse quantization table is changed, it is possible to appropriately calculate the table value again.

Configuration Example of a Computation Apparatus

Figure 22:
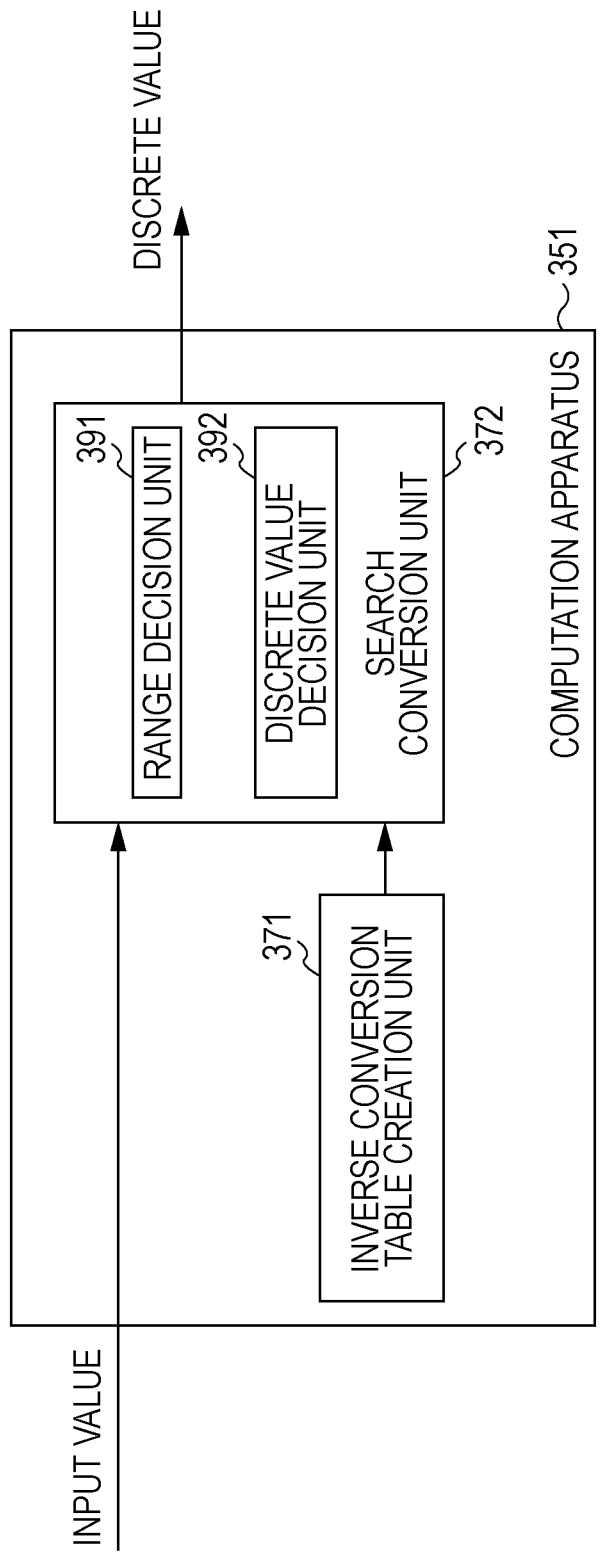
FIG. 22 is a block diagram of a configuration example of a computation apparatus according to an embodiment to which the present invention is applied.

Now, with reference to a block diagram of FIG. 22, a description will be provided on a computation apparatus configured to apply a computation based on a predetermined function func(X) on the input value X and output a discrete value Y.

A computation apparatus 351 of FIG. 22 is composed of an inverse conversion table creation unit 371 and a search conversion unit 372.

The inverse conversion table creation unit 371 calculates, for example, on the basis of Expression (10) described above, an inverse conversion value W corresponding to the discrete value Y to create an inverse conversion table in which the discrete values Y correspond to the inverse conversion values W and supplies the inverse conversion table to the search conversion unit 372.

On the basis of the inverse conversion table supplied from the inverse conversion table creation unit 371, the search conversion unit 372 decides which range the input value X thus input is included among ranges where the inverse conversion values W adjacent in the inverse conversion table are set as border values and outputs the discrete value Y corresponding to the relevant range.

The search conversion unit 372 is provided with a range decision unit 391 and a discrete value decision unit 392.

When the input value X is input, the range decision unit 391 decides which range the input value X is included among the ranges where the inverse conversion values W adjacent in the inverse conversion table are set as the border values.

The discrete value decision unit 392 decides the discrete value Y corresponding to the inverse conversion value W whose value is close to the input value X among the inverse quantized values W serving as the border values of the range decided by the range decision unit 391 and outputs the discrete value Y to an external apparatus.

With the above-mentioned configuration, on the basis of the inverse conversion values in the previously created inverse conversion table, the computation apparatus 351 searches for a discrete value corresponding to the input value thus input and outputs the discrete value.

Inverse Conversion Table Creation Processing by the Computation Apparatus

Figure 23:
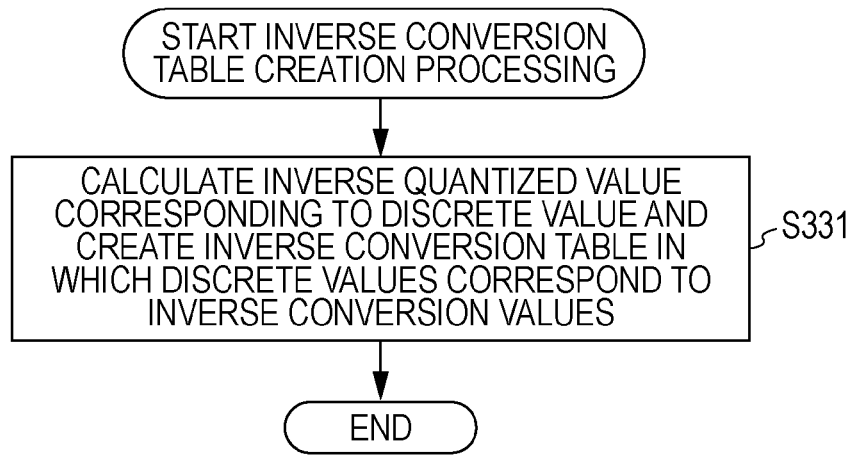
FIG. 23 is a flow chart for describing an inverse quantization table creation processing by the computation apparatus of FIG. 22.

Next, with reference to a flow chart of FIG. 23, the inverse conversion table creation processing by the computation apparatus 351 of FIG. 22 will be described. In the computation apparatus 351, the inverse conversion table creation processing is carried out before a discrete value search processing is performed.

In step S331, the inverse conversion table creation unit 371 calculates, for example, on the basis of Expression (10) described above, the inverse conversion value W corresponding to the discrete value Y to create the inverse conversion table in which the discrete values Y correspond to the inverse conversion values W and supplies the inverse conversion table to the search conversion unit 372.

As the result of the above-mentioned processing, before the discrete value conversion processing is carried out, it is possible to create the inverse conversion table in which the inverse conversion values correspond to the discrete values.

Discrete Value Search Processing by the Computation Apparatus

Figure 24:
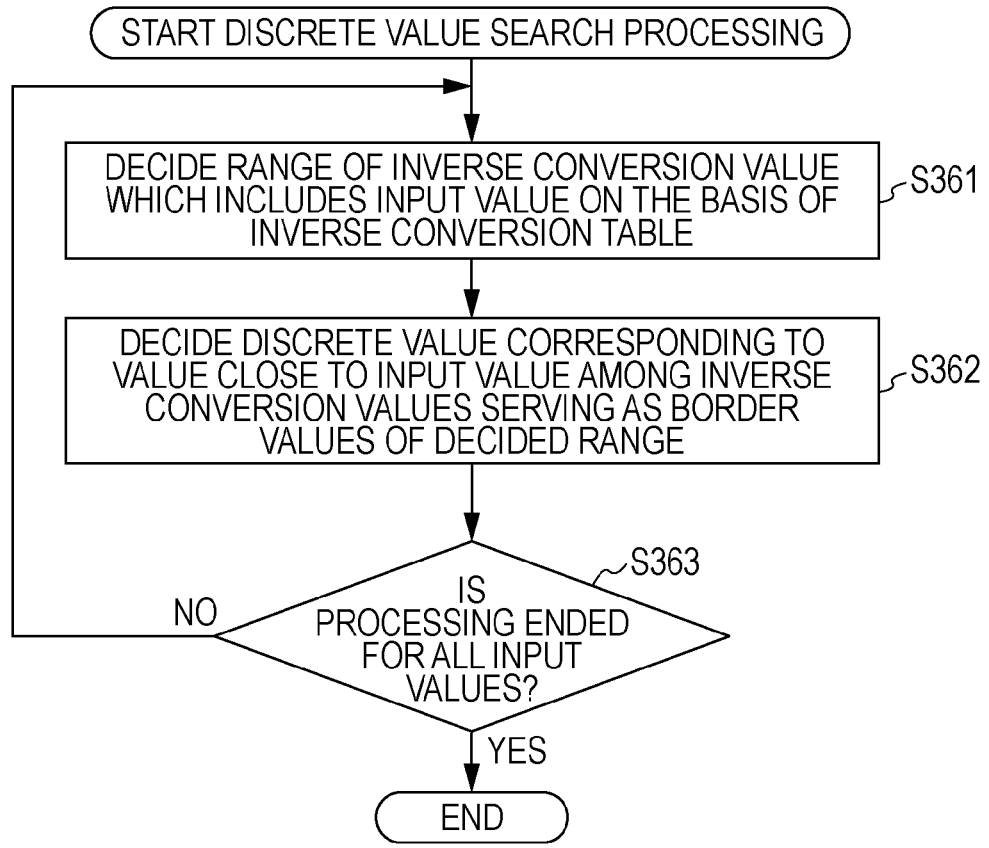
FIG. 24 is a flow chart for describing a discrete value search processing by the computation apparatus of FIG. 22.

Next, with reference to a flow chart of FIG. 24, the discrete value search processing by the computation apparatus 351 of FIG. 22 will be described.

In step S361, the range decision unit 391 decides in which range the input value X is included among the ranges where the inverse conversion values W adjacent in the inverse conversion table are set as the border values.

In step S362, the discrete value decision unit 392 decides the discrete value Y corresponding to the inverse conversion value W whose value is close to the input value X among the inverse quantized values W serving as the border values of the range decided by the range decision unit 391 and outputs the discrete value Y to the external apparatus.

In step S363, the search conversion unit 372 determines whether or not the processing of deciding the discrete value Y is ended with respect to all the input values X. In a case where it is determined that the processing of deciding the discrete value Y is not ended with respect to all the input values X, the processing is returned to step S361, and until the processing is ended with respect to all the input values X, the processing in steps S361 to S363 is repeatedly performed.

As the result of the above-mentioned processing, by using the inverse conversion table representing the relation between the discrete values Y and the inverse conversion values W, it is possible to decide the discrete value Y corresponding to the input value X thus input. That is, without creating the conversion table representing the relation between the input values X and the discrete values Y, it suffices that only the inverse conversion table is prepared, and it is thus possible to reduce the memory capacity used for the processing.

It should be noted that the computation apparatus 351 of FIG. 22 has one inverse conversion table in which with respect to one input value X, the discrete value Y corresponding to the relevant input value X corresponds to the inverse conversion value W. However, the computation apparatus 351 may have a plurality of inverse conversion tables respectively in which the corresponding discrete value corresponds to the inverse conversion value thereof for each type of the input values. That is, the computation apparatus 351 reads out the corresponding inverse conversion table in accordance with the information indicating the type of the input value, the address, and the like, and uses the read inverse conversion table, so that the discrete value corresponding to the input value thereof can be output.

As a result, with respect to the input values of a plurality of types, even in a case where the respective discrete values are output, by reading out the inverse conversion table in accordance with the type of the input value, it is possible to output the discrete values of a plurality of types by only using one computation apparatus.

The above-mentioned series of processings including a list display processing can be executed by using hardware and also executed by using software. In a case where the above-mentioned series of processings is executed by using the software, a program constituting the software is installed from the recording media, for example, to a computer incorporated in dedicated-use hardware or a general-use personal computer or the like which can execute various functions by installing various programs, and the like.

FIG. 25 is a block diagram showing a configuration example of the hardware of the computer which executes the above-mentioned series of processings by way of the program.

In the computer, a CPU (Central Processing Unit) 901, a ROM (Read Only Memory) 902, and a RAM (Random Access Memory) 903 are mutually connected by the bus 904.

Furthermore, an input and output interface 905 is connected to the bus 904. To the input and output interface 905, an input unit 906 composed of a key board, a mouse, and the like, an output unit 907 composed of a display, a speaker, and the like, a storage unit 908 composed of a hard disk, a non-volatile memory, and the like, a communication unit 909 composed of a network interface, and a drive 910 configured to drive removal media 911 composed of a magnetic disk, an optical disk, an opto-magnetic disk, a semiconductor memory, and the like are connected.

In the computer configured in the above-mentioned manner, the CPU 901 loads, for example, the program stored on the storage unit 908 onto the RAM 903 via the input and output interface 905 and the bus 904 and executes the program, so that the above-mentioned series of processings are performed.

The program executed by the computer (the CPU 901) is provided while being recorded, for example, on the removal media 911 which is package media composed of the magnetic disk (including a flexible disk), the optical disk (including a CD-ROM (Compact Disc-Read Only Memory), a DVD (Digital Versatile Disc) or the like), the opto-magnetic disk, the semiconductor memory, or the like, or provided via a wired or wireless transmission medium such as a local area network, the internet, or digital satellite broadcasting.

Then, by mounting the removal media 911 to the drive 910, the program can be installed to the storage unit 908 via the input and output interface 905. Also, the program can be received via the wired or wireless transmission medium by the communication unit 909 and installed to the storage unit 908. In addition, the program can be previously installed to the ROM 902 or the storage unit 908.

It should be noted that the program executed by the computer may be a program in which the processings are executed in a time series manner in the stated order in the present specification or may also be a program in which the processings are executed in a parallel manner or at an appropriate timing when, for example, a call is carried out.

The present application contains subject matter related to that disclosed in Japanese Priority Patent Application JP 2008-247682 filed in the Japan Patent Office on Sep. 26, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:
1. A computation apparatus comprising:
    inverse conversion table creation means configured to create an inverse conversion table mapping each discrete value Z of a plurality of discrete values to a corresponding inverse conversion value W, wherein:
        each discrete value Z is obtained by applying a predetermined conversion on predetermined data; and the corresponding inverse conversion value W is obtained by applying a conversion inverse of the predetermined conversion on the discrete value Z;

range decision means configured to determine in which range of a plurality of ranges a value Y is included, where the value Y is determined based input data X and the inverse conversion values adjacent in the inverse conversion table are set as border values of the plurality of ranges; and discrete value decision means configured to determine the discrete value Z corresponding to the inverse conversion value W which is closer to the value Y among the inverse conversion values serving as the border values of the range decided by the range decision means.

2. The computation apparatus according to claim 1, further comprising:

hash table creation means configured to create a hash table based at least in part on the inverse conversion table, wherein the range decision means determines an initial search value for the range in the inverse conversion table for at least one of the plurality of ranges based at least in part on the hash table and determines in which range the value Y is included in the inverse conversion table based at least in part on the initial search value.

3. The computation apparatus according to claim 2, wherein the hash table creation means creates the hash table by using at least one of an exponent part and a significand part of the inverse conversion values serving as the border values of the range in the inverse conversion table.

4. The computation apparatus according to claim 1, wherein the range decision means performs a binary search for the range in which the value Y is included in the inverse conversion table.

5. A computation method comprising acts of:

creating an inverse conversion table mapping each discrete value Z of a plurality of discrete values to a corresponding inverse conversion value W, wherein:

each discrete value Z is obtained by applying a predetermined conversion on predetermined data; and the corresponding inverse conversion value W is obtained by applying a conversion inverse of the predetermined conversion on the discrete value Z;

determining in which range of a plurality of ranges a value Y is included, where the value Y is determined based on input data X and the inverse conversion values adjacent in the inverse conversion table are set as border values of the plurality of ranges; and determining the discrete value Z corresponding to the inverse conversion value W which is closer to the value Y among the inverse conversion values serving as the border values of the range determined in the range determining act.

6. At least one computer-readable storage device having stored thereon a program for instructing a computer to execute a processing comprising acts of:

creating an inverse conversion table mapping each discrete value Z of a plurality of discrete values to a corresponding inverse conversion value W, wherein:

each discrete value Z is obtained by applying a predetermined conversion on predetermined data; and the corresponding inverse conversion value W is obtained by applying a conversion inverse of the predetermined conversion on the discrete value Z;

determining in which range of a plurality of ranges a value Y is included, where the value Y is determined based on input data X and the inverse conversion values adjacent in the inverse conversion table are set as border values of the plurality of ranges; and determining the discrete value Z corresponding to the inverse conversion value W which is closer to the value Y among the inverse conversion values serving as the border values of the range determined in the range determining act.

7. A computation apparatus comprising:

an inverse conversion table creation unit configured to create an inverse conversion table mapping each discrete value Z of a plurality of discrete values to a corresponding inverse conversion value W, wherein:

each discrete value Z is obtained by applying a predetermined conversion to predetermined data; and the corresponding inverse conversion value W is obtained by applying a conversion that is inverse to the predetermined conversion to the discrete value Z;

a range decision unit configured to determine in which range of a plurality of ranges a value Y is included, where the value Y is determined based on input data X and the inverse conversion values adjacent in the inverse conversion table are set as border values of the plurality of ranges; and a discrete value decision unit configured to determine the discrete value Z corresponding to the inverse conversion value W which is closer to the value Y among the inverse conversion values serving as the border values of the range decided by the range decision unit.

* * * * *